(12) United States Patent
Yamazawa

(10) Patent No.: US 9,351,389 B2
(45) Date of Patent: *May 24, 2016

(54) PLASMA PROCESSING APPARATUS

(75) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1015 days.

This patent is subject to a terminal disclaimer.

(21) Appl. No.: 13/247,064

(22) Filed: Sep. 28, 2011

(65) Prior Publication Data

US 2012/0073757 A1    Mar. 29, 2012

Related U.S. Application Data

(60) Provisional application No. 61/391,895, filed on Oct. 11, 2010.

(30) Foreign Application Priority Data

Sep. 28, 2010   (JP) ................................. 2010-216844

(51) Int. Cl.
| | |
|---|---|
| *C23C 16/00* | (2006.01) |
| *C23F 1/00* | (2006.01) |
| *H01L 21/306* | (2006.01) |
| *H05H 1/46* | (2006.01) |
| *H01J 37/32* | (2006.01) |

(52) U.S. Cl.
CPC ............... *H05H 1/46* (2013.01); *H01J 37/3211* (2013.01); *H05H 2001/4667* (2013.01)

(58) Field of Classification Search
USPC ........ 156/345.48, 345.49; 118/723 I, 723 IR; 315/111.51
See application file for complete search history.

(56) References Cited

U.S. PATENT DOCUMENTS

| | | | |
|---|---|---|---|
| 5,800,619 | A | 9/1998 | Holland et al. |
| 6,288,493 | B1 | 9/2001 | Lee et al. |
| 6,414,648 | B1 * | 7/2002 | Holland et al. ............... 343/895 |
| 6,463,875 | B1 * | 10/2002 | Chen et al. .................. 118/723 I |

(Continued)

FOREIGN PATENT DOCUMENTS

| | | | | |
|---|---|---|---|---|
| CN | 1638599 | A | 7/2005 | |
| CN | 101730375 | A | 6/2010 | |
| JP | 10-064697 | * | 3/1998 | ............... H05H 1/46 |
| JP | 10-064697 | A | 3/1998 | |
| JP | 2004-509429 | A | 3/2004 | |
| JP | 2004-363247 | A | 12/2004 | |

(Continued)

OTHER PUBLICATIONS

English Machine Translation JP 10064697, Takagi dated Mar. 6, 1998.*

*Primary Examiner* — Rakesh Dhingra
(74) *Attorney, Agent, or Firm* — Pearne & Gordon LLP

(57) ABSTRACT

There is provided a plasma processing apparatus including a processing chamber having a dielectric window; a substrate holding unit for holding thereon a processing target substrate within the processing chamber; a processing gas supply unit configured to supply a processing gas into the processing chamber in order to perform a plasma process on the substrate; a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas. Here, the RF antenna includes a plurality of coil segments that are arranged along a loop having a preset shape and a preset size while electrically connected in parallel to each other.

41 Claims, 28 Drawing Sheets

(56) References Cited

U.S. PATENT DOCUMENTS

| | | | |
|---|---|---|---|
| 6,495,963 B1* | 12/2002 | Bennett | 315/111.51 |
| 2003/0006019 A1* | 1/2003 | Johnson | H05H 1/46 |
| | | | 164/1 |
| 2004/0124779 A1* | 7/2004 | Howald et al. | 315/111.51 |
| 2004/0255864 A1* | 12/2004 | Jeon et al. | 118/723.001 |
| 2009/0162570 A1* | 6/2009 | Swenberg | H01J 37/321 |
| | | | 427/569 |
| 2010/0066251 A1* | 3/2010 | Nakagami et al. | 315/111.51 |

FOREIGN PATENT DOCUMENTS

| | | | |
|---|---|---|---|
| JP | 2006-518915 A | 8/2006 | |
| JP | WO 2008065744 * | 6/2008 | .......... H01L 21/3065 |
| JP | 2009-277859 A | 11/2009 | |
| JP | 2010-165677 A | 7/2010 | |
| TW | 503435 | 9/2002 | |
| TW | 201026166 A | 7/2010 | |
| WO | 02/05308 A2 | 1/2002 | |
| WO | 2004/077608 A2 | 9/2004 | |

* cited by examiner (CURRENT DENSITY DISTRIBUTION WITHIN
DONUT-SHAPED PLASMA)

(COMPARATIVE EXAMPLE)

| ELECTROSTATIC CAPACITANCE (pF) | IMPEDANCE (Ω) | CURRENT (A) |
|---|---|---|
| 450 | 8.0 | 21.3 |
| 500 | 10.6 | 16.1 |
| 600 | 14.5 | 11.7 |
| 700 | 17.3 | 9.8 |
| 800 | 19.4 | 8.8 |
| 1200 | 24.3 | 7.0 |

| ELECTROSTATIC CAPACITANCE (pF) | IMPEDANCE (Ω) | CURRENT (A) |
|---|---|---|
| 900 | 4.0 | 21.3 |
| 1000 | 5.3 | 16.1 |
| 1200 | 7.2 | 11.7 |
| 1400 | 8.6 | 9.8 |
| 1600 | 9.7 | 8.8 |
| 2400 | 12.1 | 7.0 |

PLASMA PROCESSING APPARATUS

CROSS-REFERENCE TO RELATED APPLICATION

This application claims the benefit of Japanese Patent Application No. 2010-216844 filed on Sep. 28, 2010 and U.S. Provisional Application Ser. No. 61/391,895 filed on Oct. 11, 2010, the entire disclosures of which are incorporated herein by reference.

FIELD OF THE INVENTION

The present disclosure relates to a technique for performing a plasma process on a processing target substrate; and, more particularly, to an inductively coupled plasma processing apparatus.

BACKGROUND OF THE INVENTION

In a manufacturing process of a semiconductor device or a FPD (Flat Panel Display), plasma is used to perform a process, such as etching, deposition, oxidation or sputtering, so as to perform a good reaction of a processing gas at a relatively low temperature. Conventionally, plasma generated by a high frequency electric discharge in MHz frequency band has been used in this kind of plasma process. The plasma generated by the high frequency electric discharge is largely divided into capacitively coupled plasma and inductively coupled plasma according to a plasma generation method (in view of an apparatus).

Generally, in an inductively coupled plasma processing apparatus, at least a part (for example, a ceiling) of walls of a processing chamber may have a dielectric window, and a high frequency power is supplied to a coil-shaped RF antenna positioned at an outside of this dielectric window. The processing chamber serves as a depressurizable vacuum chamber, and a target substrate (for example, a semiconductor wafer and a glass substrate) is provided at a central region within the chamber. A processing gas is supplied into a processing space formed between the dielectric window and the substrate. A high frequency AC magnetic field having magnetic force lines is generated around the RF antenna by a high frequency current flowing in the RF antenna. The magnetic force lines of the high frequency AC magnetic field are transmitted to the processing space within the chamber via the dielectric window. As the RF magnetic field of the high frequency AC magnetic field changes with time, an inductive electric field is generated in an azimuth direction within the processing space. Then, electrons accelerated by this inductive electromagnetic field in the azimuth direction collide with molecules or atoms of the processing gas so as to be ionized. In this process, a donut-shaped plasma may be generated.

Since a large processing space is formed within the chamber, the donut-shaped plasma can be diffused efficiently in all directions (particularly, in a radial direction) and a plasma density on the substrate becomes very uniform. However, only with a conventional RF antenna, the plasma density on a substrate is not sufficiently uniform for most plasma processes. In the plasma process, it is also one of the important issues to improve uniformity of a plasma density on a substrate since a uniformity/reproducibility and a production yield of a plasma process depend on the plasma uniformity.

In the inductively coupled plasma processing apparatus, a characteristic (profile) of plasma density distribution within the donut-shaped plasma formed in the vicinity of the dielectric window within the chamber is important. Especially, the profile of plasma density distribution affects characteristics (especially, uniformity) of plasma density distribution on the substrate after the diffusion of the plasma.

In this regard, there have been proposed several methods for improving uniformity of plasma density distribution in a circumferential direction by dividing the RF antenna into a multiple number of circular ring-shaped coils each having different diameter. There are two types of RF antenna division methods: a first type of connecting the multiple number of circular ring-shaped coils in series (see, for example, Patent Document 1) and a second type of connecting the multiple number of circular ring-shaped coils in parallel (see, for example, Patent Document 2).

Patent Document 1: U.S. Pat. No. 5,800,619
Patent Document 2: U.S. Pat. No. 6,288,493

In accordance with the first type method among the aforementioned conventional RF antenna division methods, since an entire coil length of the RF antenna is large as a sum of all the coils, a voltage drop within the RF antenna may be fairly large and not negligible. Further, due to a wavelength effect, a standing wave of electric current having a node in the vicinity of a RF input terminal of the RF antenna may be easily formed. For these reasons, in accordance with this first type method, it may be difficult to achieve uniformity of plasma density distribution in a diametrical direction as well as in a circumferential direction. Thus, the first type method is deemed to be inadequate for a plasma process for which large-diameter plasma is necessary.

Meanwhile, in the second type method, a RF current supplied to the RF antenna from a high frequency power supply may flow in a greater amount through an inner coil having a smaller diameter (i.e., smaller impedance), whereas a relatively small amount of RF current may flow through an outer coil having a larger diameter (i.e., larger impedance) within the RF antenna. Accordingly, plasma density within the chamber may be high at a central portion of the chamber in a radial direction while the plasma density may be low at a peripheral portion thereof. Thus, in the second type method, capacitors for adjusting impedance are additionally coupled to the respective coils within the RF antenna so as to adjust a split ratio of the RF current flowing through the respective coils.

In such a case, if a capacitor for adjusting impedance is provided on a return line or an earth line of the high frequency power supply, i.e., on an end of the RF antenna, an electric potential of a coil may become higher than a ground potential, so that a sputtering effect causing damage and degradation of the dielectric window by ion attack from the plasma can be suppressed. However, since the coil of the RF antenna is electrically terminated through the capacitor, a length of an equivalent short-circuit resonance line is shortened. As a result, a wavelength effect may easily occur in the outer coil having the larger diameter (length). Therefore, there may occur the same problem as mentioned in the first type method.

BRIEF SUMMARY OF THE INVENTION

In view of the above, the present disclosure provides an inductively coupled plasma processing apparatus capable of suppressing a wavelength effect within a RF antenna, and also capable of performing a plasma process uniformly both in a circumferential direction and in a radial direction.

In accordance with one embodiment of the present disclosure, there is provided a plasma processing apparatus including a processing chamber having a dielectric window; a substrate holding unit for holding thereon a processing target substrate within the processing chamber; a processing gas supply unit configured to supply a processing gas into the processing chamber in order to perform a plasma process on the substrate; a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas. Here, the RF antenna may include a plurality of coil segments that are spatially arranged along a loop having a preset shape and a preset size while electrically connected in parallel to each other.

In accordance with another embodiment of the present disclosure, there is provided a plasma processing apparatus including a processing chamber having a dielectric window; a substrate holding unit for holding thereon a processing target substrate within the processing chamber; a processing gas supply unit configured to supply a processing gas into the processing chamber in order to perform a plasma process on the substrate; a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas. Here, the RF antenna may include an inner coil and an outer coil respectively provided at an inner side and an outer side thereof in a radial direction with a gap therebetween. Further, the inner coil may include a single inner coil segment or more than one inner coil segments connected in series. Furthermore, the outer coil may include a plurality of outer coil segments separated in a circumferential direction and electrically connected with each other in parallel.

In accordance with still another embodiment of the present disclosure, there is provided a plasma processing apparatus including a processing chamber having a dielectric window; a substrate holding unit for holding thereon a processing target substrate within the processing chamber; a processing gas supply unit configured to supply a processing gas into the processing chamber in order to perform a plasma process on the substrate; a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas. Here, the RF antenna may include an inner coil and an outer coil respectively provided at an inner side and an outer side thereof in a radial direction with a gap therebetween. Further, the inner coil may include a plurality of inner coil segments separated in a circumferential direction and electrically connected with each other in parallel. Furthermore, the outer coil may include a plurality of outer coil segments separated in a circumferential direction and electrically connected with each other in parallel.

In accordance with the plasma processing apparatus of the present disclosure, each coil of the RF antenna may include a single or a multiple number of coil segments, and, specifically, the multiple number of coil segments of the outer coil may be electrically connected in parallel to each other. In such a configuration, a wavelength effect or a voltage drop within the RF antenna may depend on the length of each of the coil segments. Accordingly, the coil segment number or the coil segment length within each coil may be set so as not to allow the occurrence of the wavelength effect within the individual coil segments and so as not to increase the voltage drop. As for magnetomotive force within the RF antenna 54, the coil segments of each coil have substantially the same self-inductance, so that a regular or uniformized high frequency currents flow in the circumferential directions of the coils. As a result, substantially uniformized plasma density distribution can constantly be obtained in the circumferential directions of the coils. Further, it may be possible to obtain the magnetomotive force balance between two coils by adjusting diameters of the inner coil and the outer coil. As a result, desired plasma density distribution may be obtained.

In accordance with the plasma processing apparatus of the present disclosure, by using the above-described configuration and operation, it may be possible to suppress a wavelength effect within the RF antenna. Furthermore, it may be also possible to perform the plasma process uniformly both in the circumferential direction and in the radial direction.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, the embodiments of the present disclosure will be described in detail with reference to the accompanying drawings.

[Entire Configuration and Operation of Apparatus]

Figure 1:
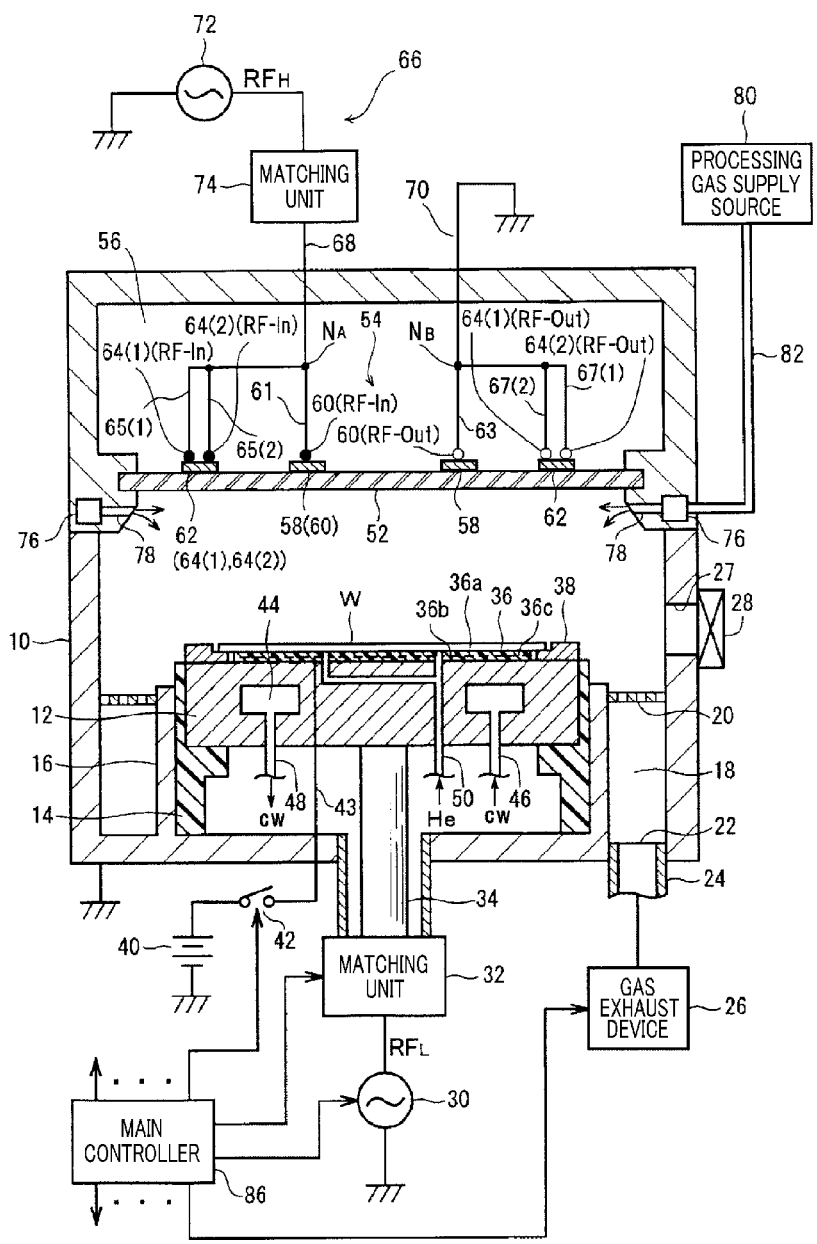
FIG. 1 is a longitudinal cross sectional view showing a configuration of an inductively coupled plasma processing apparatus in accordance with an embodiment of the present disclosure.

FIG. 1 illustrates a configuration of an inductively coupled plasma processing apparatus in accordance with an embodiment of the present disclosure.

This plasma processing apparatus is configured as an inductively coupled plasma etching apparatus using a planar coil RF antenna. By way of example, the plasma processing apparatus may include a cylindrical vacuum chamber (processing chamber) 10 made of metal such as aluminum or stainless steel. The chamber 10 may be frame grounded.

Above all, there will be explained a configuration of each component which is not related to plasma generation in this inductively coupled plasma processing apparatus.

At a lower central region within the chamber 10, a circular plate-shaped susceptor 12 may be provided horizontally. The susceptor 12 may mount thereon a target substrate such as a semiconductor wafer W and may serve as a high frequency electrode as well as a substrate holder. This susceptor 12 may be made of, for example, aluminum and may be supported by a cylindrical insulating support 14 which may be extended uprightly from a bottom of the chamber 10.

Between a cylindrical conductive support 16 which is extended uprightly from a bottom of the chamber 10 along the periphery of the cylindrical insulating support 14 and an inner wall of the chamber 10, an annular exhaust line 18 may be provided. Further, an annular baffle plate 20 may be provided at an upper portion or an inlet of the exhaust line 18. Further, an exhaust port 22 may be provided at a bottom portion. In order for a gas flow within the chamber 10 to be uniformized with respect to an axis of the semiconductor wafer W on the susceptor 12, multiple exhaust ports 22 equi-spaced from each other along a circumference may be provided. Each exhaust port 22 may be connected to a gas exhaust device 26 via an exhaust pipe 24. The gas exhaust device 26 may include a vacuum pump such as a turbo molecular pump or the like. Thus, it may be possible to depressurize a plasma generation space within the chamber 10 to a required vacuum level. At an outside of a sidewall of the chamber 10, a gate valve 28 configured to open and close a loading/unloading port 27 of the semiconductor wafer W may be provided.

The susceptor 12 may be electrically connected to a high frequency power supply 30 for RF bias via a matching unit 32 and a power supply rod 34. This high frequency power supply 30 may be configured to output a variable high frequency power $RF_L$ having an appropriate frequency (typically, about 13.56 MHz or less) to control energies of ions attracted into the semiconductor wafer W. The matching unit 32 may accommodate a variable reactance matching circuit for performing matching between an impedance of the high frequency power supply 30 and an impedance of a load (mainly, susceptor, plasma and chamber). The matching circuit may include a blocking capacitor configured to generate a self-bias.

An electrostatic chuck 36 for holding the semiconductor wafer W by an electrostatic attraction force may be provided on an upper surface of the susceptor 12. Further, a focus ring 38 may be provided around the electrostatic chuck 36 to annularly surround the periphery of the semiconductor wafer W. The electrostatic chuck 36 may be formed by placing an electrode 36a made of a conductive film between a pair of insulating films 36b and 36c. A high voltage DC power supply 40 may be electrically connected to the electrode 36a via a switch 42 and a coated line 43. By applying a high DC voltage from the DC power supply 40, the semiconductor wafer W can be attracted to and held on the electrostatic chuck 36 by the electrostatic force.

A coolant path 44 of, e.g., a circular ring-shape, may be formed within the susceptor 12. A coolant, such as cooling water cw, having a certain temperature may be supplied into and circulated through the coolant path 44 from a chiller unit (not illustrated) via lines 46 and 48. By adjusting the temperature of the cooling water cw, it may be possible to control a process temperature of the semiconductor wafer W held on the electrostatic chuck 36. Further, a heat transfer gas, such as a He gas, may be supplied from a heat transfer gas supply unit (not illustrated) into a space between an upper surface of the electrostatic chuck 36 and a rear surface of the semiconductor wafer W through a gas supply line 50. Furthermore, an elevating mechanism (not shown) including lift pins configured to move up and down vertically through the susceptor 12 may be provided to load and unload the semiconductor wafer W.

Hereinafter, there will be explained a configuration of each component which is related to plasma generation in this inductively coupled plasma processing apparatus.

A ceiling or a ceiling plate of the chamber 10 may be separated relatively far from the susceptor 12. A circular dielectric window 52 formed of, for example, a quartz plate may be airtightly provided as the ceiling plate. Above the dielectric window 52, an antenna chamber 56 may be provided as a part of the chamber 10. The antenna chamber 56 may accommodate therein a RF antenna 54 and shield this RF antenna 54 from the outside. Here, the RF antenna 54 may generate inductively coupled plasma within the chamber 10.

The RF antenna 54 is provided in parallel to the dielectric window 52. The RF antenna 54 may include an inner coil 58 and an outer coil 62 with a certain gap therebetween in a radial direction. In the present embodiment, the inner coil 58 and the outer coil 62 have a circular ring shape and are coaxially arranged. Further, the inner coil 58 and the outer coil 62 are also arranged concentrically with each other as well as with the chamber 10 or the susceptor 12.

In the present disclosure, the term "coaxial" means that central axes of multiple objects having axisymmetric shape are aligned with each other. As for multiple coils, respective coils surfaces may be offset with each other in an axial direction or may be aligned on the same plane (positioned concentrically).

Further, the inner coil 58 and the outer coil 62 are electrically connected in parallel between a high frequency power supply line 68 from a high frequency power supply unit for plasma generation and a return line 70 toward a ground potential member (i.e., between two nodes $N_A$ and $N_B$). Here, the return line 70 as an earth line is grounded and is connected with a ground potential member (for example, the chamber 10 or other member) that is electrically maintained at a ground potential.

The high frequency power supply unit 66 may include a high frequency power supply 72 and a matching unit 74. The high frequency power supply 72 is capable of outputting a variable high frequency power $RF_H$ having a frequency (typically, equal to or higher than about 13.56 MHz) for generating plasma by an inductively coupled high frequency electric discharge. The matching unit 74 has a reactance-variable matching circuit for performing matching between an impedance of the high frequency power supply 72 and an impedance of load (mainly, RF antenna or plasma).

A processing gas supply unit for supplying a processing gas into the chamber 10 may include an annular manifold or buffer unit 76; multiple sidewall gas discharge holes 78; and a gas supply line 82. The buffer unit 76 may be provided at an inside (or outside) of the sidewall of the chamber 10 to be located at a position slightly lower than the dielectric window 52. The sidewall gas discharge holes 78 may be formed along a circumference at a regular interval and opened to the plasma generation space from the buffer unit 76. The gas supply line 82 may be extended from a processing gas supply source 80 to the buffer unit 76. The processing gas supply source 80 may include a flow rate controller and an opening/closing valve (not shown).

The main controller 86 may include, for example, a micro computer and may control an operation of each component within this plasma etching apparatus, for example, the gas exhaust device 26, the high frequency power supplies 30 and 72, the matching units 32 and 74, the switch 42 for the electrostatic chuck, the processing gas supply source 80, the chiller unit (not shown), and the heat transfer gas supply unit (not shown) as well as a whole operation (sequence) of the apparatus.

In order to perform an etching process in this inductively coupled plasma processing apparatus, when the gate valve 28 becomes open, the semiconductor wafer W as a process target may be loaded into the chamber 10 and mounted on the electrostatic chuck 36. Then, after closing the gate valve 28, an etching gas (generally, an mixture gas) may be introduced into the chamber 10 from the processing gas supply source 80 via the gas supply line 82, the buffer unit 76, and the sidewall gas discharge holes 78 at a certain flow rate and a flow rate ratio. Subsequently, an internal pressure of the chamber 10 may be controlled to be a certain level by the gas exhaust device 26. Further, the high frequency power supply 72 of the high frequency power supply unit 66 is turned on, and the high frequency power $RF_H$ for plasma generation is outputted at a certain RF power level. A current of the high frequency power $RF_H$ is supplied to the inner coil 58 and the outer coil 62 of the RF antenna 54 through the matching unit 74, the RF power supply line 68 and the return line 70. Meanwhile, the high frequency power supply 30 may be turned on to output the high frequency power $RF_L$ for ion attraction control at a certain RF power level. This high frequency power $RF_L$ may be applied to the susceptor 12 via the matching unit 32 and the lower power supply rod 34. Further, a heat transfer gas (a He gas) may be supplied to a contact interface between the electrostatic chuck 36 and the semiconductor wafer W from the heat transfer gas supply unit. Furthermore, the switch 42 is turned on, and then, the heat transfer gas may be confined in the contact interface by the electrostatic force of the electrostatic chuck 36.

Within the chamber 10, an etching gas discharged from sidewall gas discharge holes 78 is diffused into a processing space below the dielectric window 52. By the current of the high frequency power $RF_H$ flowing in the coils and 62, magnetic force lines (magnetic flux) generated around these coils are transmitted to the processing space (plasma generation space) within the chamber 10 via the dielectric window 52. An induced electric field may be generated in an azimuth direction within the processing space. Then, electrons accelerated by this inductive electric field in the azimuth direction may collide with molecules or atoms of the etching gas so as to be ionized. In the process, a donut-shaped plasma may be generated.

Radicals or ions in the donut-shaped plasma may be diffused in all directions within the large processing space. To be specific, while the radicals are isotropically introduced and the ions are attracted by a DC bias, the radicals and the ions may be supplied on an upper surface (target surface) of the semiconductor wafer W. Accordingly, plasma active species may perform chemical and physical reactions on the target surface of the semiconductor wafer W so as to etch a target film into a required pattern.

Herein, "a donut-shaped plasma" is not limited to only a ring-shaped plasma which is generated only at the radial outside in the chamber 10 without being generated at the radial inside (at a central area) therein. Further, "a donut-shaped plasma" may include a state where a volume or a density of the plasma generated at the radial outside is greater than that at the radial inside. Further, depending on a kind of a gas used for the processing gas, an internal pressure of the chamber 10, or the like, the plasma may have other shapes instead of "a donut shape".

In this inductively coupled plasma etching apparatus, the inner coil 58 and the outer coil 62 are configured to have specific spatial layout and electric connection to be described below. Further, by adding an impedance adjusting unit, a wavelength effect or a potential difference (voltage drop) within the RF antenna 54 can be effectively suppressed or reduced. Thus, it is possible to uniformize plasma process characteristics on the semiconductor wafer W, that is, etching characteristics (etching rate, selectivity or etching profile) both in a circumferential direction and in a radial direction.

[Basic Configuration of RF Antenna]

Major characteristics of this inductively coupled plasma etching apparatus include the internal spatial layout and electric connection of the RF antenna 54.

Figure 2A:
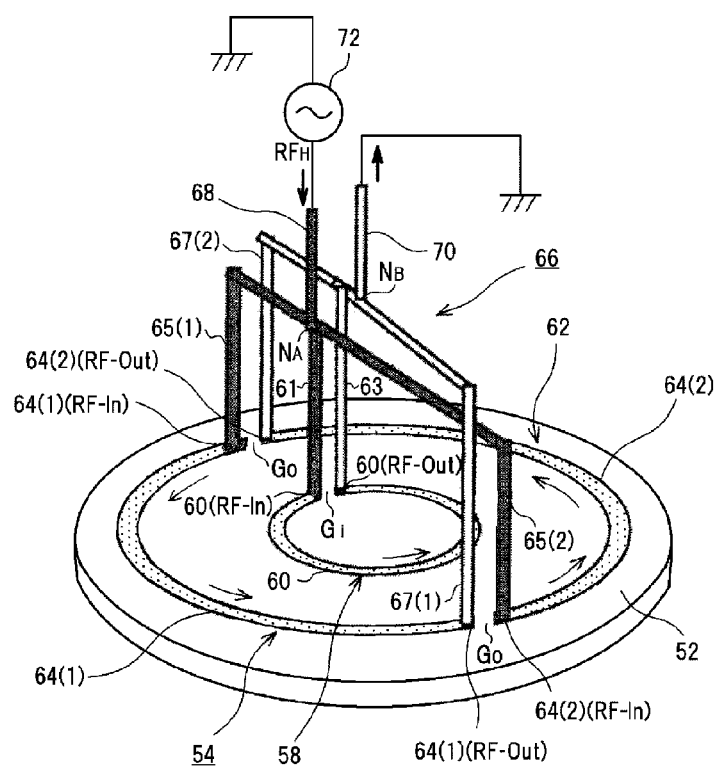
FIG. 2A is a perspective view illustrating a basic layout and an electric connection of a RF antenna in accordance with the embodiment of the present disclosure.
Figure 2B:
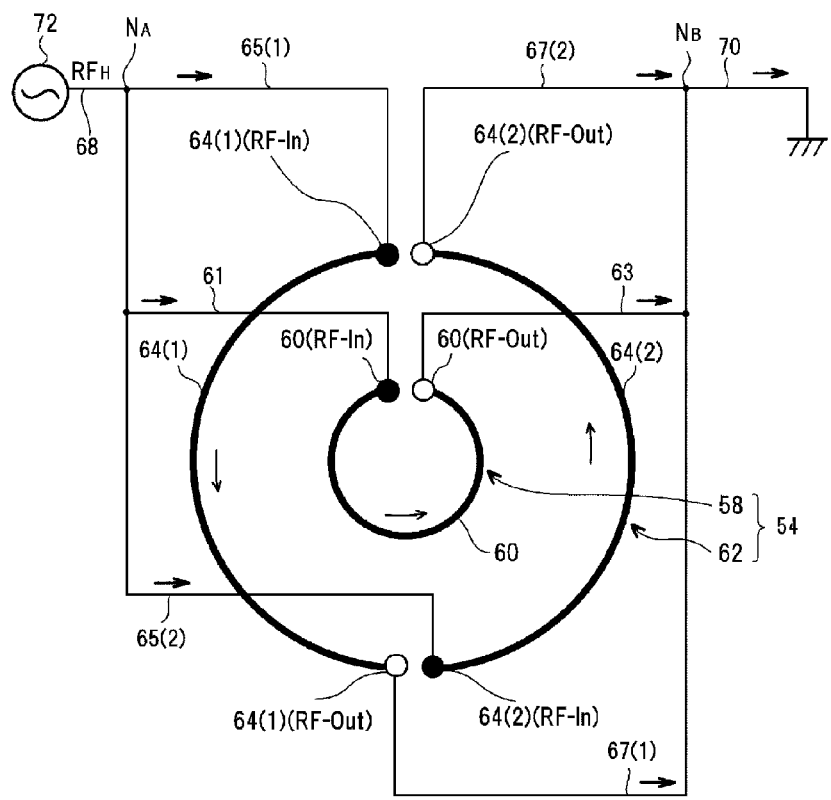
FIG. 2B is an electric connection diagram corresponding to the configuration of FIG. 2A.

FIGS. 2A and 2B illustrate a basic configuration of the layout and the electric connection (circuit) of the RF antenna 54 in accordance with the embodiment of the present disclosure.

Desirably, the inner coil 58 may include a single circular coil segment 60, and may be located near a center of the chamber 10 in the radial direction. Below, an each coil segment of the inner coil 58 will be referred to as an "inner coil segment."

This inner coil segment 60 is a single body and is annularly extended along one round in a circumference direction or along the most of one round in the circumference direction. Both ends 60(RF-In) and 60(RF-Out) of the inner coil segment 60 are positioned adjacently or face to each other with an inner gap $G_i$ therebetween in the circumferential direction. In the present disclosure, a gap or a space formed in the loop of the inner coil 58 is referred to as an "inner gap."

One end of the inner coil segment 60, i.e., the RF input terminal 60(RF-In) is connected with the RF power supply line 68 led from the high frequency power supply unit 66 via a connection conductor 61 and the first node $N_A$. The other end of the inner coil segment 60, i.e., the RF output terminal 60(RF-Out) is connected with the earth line 70 via an upwardly extending connection conductor 63 and the second node $N_B$.

Desirably, the outer coil 62 may include a multiple number of (e.g., two) coil segments 64(1) and 64(2) separated in the circumferential direction. The outer coil is located near the sidewall of the chamber 10. Hereinafter, each coil segment of the outer coil 62 will be referred to as an "outer coil segment."

Spatially, each of two outer coil segments 64(1) and 64(2) has a semicircular shape. These two outer coil segments 64(1) and 64(2) are arranged in series to be extended along one round in a circumferential direction or along the most of one round in the circumference direction. To elaborate, in a one-round loop of the outer coil 62, a RF input terminal 64(1)(RF-In) of the first outer coil segment 64(1) and a RF output terminal 64(2)(RF-Out) of the second outer coil segment 64(2) are adjacently positioned or face to each other with an outer gap $G_o$ therebetween in the circumferential direction. Further, a RF output terminal 64(1)(RF-Out) of the first outer coil segment 64(1) and a RF input terminal 64(2)(RF-In) of the second outer coil segment 64(2) are adjacently positioned or face to each other with another outer gap $G_o$ therebetween in the circumferential direction. In the present disclosure, a gap or a space formed in the loop of the outer coil 62 will be referred to as an "outer gap."

One ends of the outer coil segments 64(1) and 64(2), i.e., the RF input terminals 64(1)(RF-In) and 64(2)(RF-In) are electrically connected with the RF power supply line 68 led from the high frequency power supply unit 66 via upwardly extending connection conductors 65(1) and 65(2) and the first node $N_A$, respectively. Further, the other ends of the outer coil segments 64(1) and 64(2), i.e., the RF output terminals 64(1)(RF-Out) and 64(2)(RF-Out) are electrically connected with the earth line 70 via upwardly extending connection conductors 67(1) and 67(2) and the second node $N_B$, respectively.

In this way, between the RF power supply line 68 led from the high frequency power supply unit 66 and the earth line 70 connected with the ground potential member or between the first node $N_A$ and the second node $N_B$, the two outer coil segments 64(1) and 64(2) of the outer coil 62 are electrically connected in parallel to each other, and the single inner coil segment 60 of the inner coil 58 is also electrically connected with the outer coil segments 64(1) and 64(2) in parallel. Further, the respective components of the RF antenna 54 between the first and second nodes $N_A$ and $N_B$ are electrically connected such that a direction of a high frequency current flowing in the outer coil segment 64(1) is the same as a direction of a high frequency current flowing in the outer coil segment 64(2) in the circumferential direction. Further, a direction of a high frequency current flowing in the inner coil 58 is the same as the direction of the high frequency current flowing in the outer coil 62 in the circumferential direction.

Figure 2B:
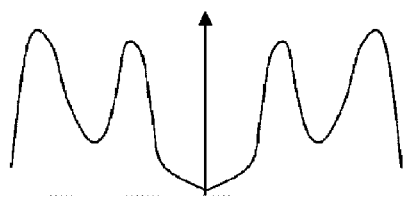

Further, as depicted in FIGS. 1 to 2B, within the antenna chamber 56 (FIG. 1), the connection conductors 61, 63, 65(1), 65(2), 67(1) and 67(2) upwardly extending from the RF antenna 54 serve as branch lines or connecting lines in horizontal directions while spaced apart from the dielectric window 52 at a sufficiently large distance (i.e., at considerably high positions). Accordingly, electromagnetic influence upon the coils 58 and 62 can be reduced.

In the present embodiment, desirably, the two outer coil segments 64(1) and 64(2) of the outer coil 62 may have the substantially same self-inductance, and the inner coil segment 60 of the inner coil 58 also has the substantially same self-inductance as those of the outer coil segments 64(1) and 64(2). Typically, by using the same material for the coil segments 60, 64(1) and 64(2) and by setting their coil diameters and coil lengths to be same, the self-inductances of the coils segments 60, 64(1) and 64(2) can be set to be same or approximate to each other.

Furthermore, when the lengths of the inner coil segment 60 and the outer coil segments 64(1) and 64(2) are same, a diameter ratio of the inner coil 58 and the outer coil 62 may be about 1:2.

In the inductively coupled plasma etching apparatus in accordance with the embodiment, the high frequency current supplied from the high frequency power supply unit flows through each component within the RF antenna 54. As a result, high frequency AC magnetic fields distributed in loop shapes are formed around the inner coil 58 and the outer coil 62 of the RF antenna 54 according to the Ampere's Law. Further, under the dielectric window 52, magnetic force lines passing through the processing space in the radial direction are formed even in a relatively lower region.

In this case, a diametric directional (horizontal) component of a magnetic flux density in the processing space may be zero (0) constantly at a central region and a periphery of the chamber 10 regardless of a magnitude of the high frequency current. Further, the radial directional (horizontal) component of a magnetic flux density in the processing space may have a maximum value at a certain portion therebetween. A strength distribution of the inductive electric field in the azimuth direction generated by the AC magnetic field of the high frequency may have the same pattern as a magnetic flux density distribution in a diametrical direction. That is, an electron density distribution within the donut-shaped plasma in the diametrical direction may substantially correspond to a current split within the RF antenna 54 in a macro view.

The RF antenna 54 of the present embodiment is different from a typical spiral coil wound from its center or inner peripheral end to an outer peripheral end thereof. That is, the RF antenna 54 includes the circular ring-shaped inner coil 58 localized to the central portion of the antenna and the circular ring-shaped outer coil 62 localized to a peripheral portion of the antenna. A current split in the RF antenna 54 in the radial direction may be concentrated in the vicinities of the two coils 58 and 62.

Here, in the RF antenna 54, as stated above, the outer coil segments 64(1) and 64(2) of the outer coil 62 have the substantially same self-inductance (i.e., the substantially same impedance) and are electrically connected in parallel to each other. Furthermore, the inner coil segment 60 of the inner coil 58 also has the substantially same self-inductance (i.e., the substantially same impedance) as those of the outer coil segments 64(1) and 64(2) and is electrically connected with the outer coil segment 64(1) and 64(2) in parallel. Accordingly, when plasma is generated, a magnitude of a high frequency current flowing in the loop of the inner coil 58 is constantly the same as a magnitude of a high frequency current flowing in the loop of the outer coil 62.

Therefore, in the donut-shaped plasma generated below (inside) the dielectric window 52 of the chamber 10, a current density (i.e. plasma density) may be remarkably increased (maximized) at both positions right below the inner coil 58 and right below the outer coil 62. Thus, a current density distribution within the donut-shaped plasma may not be uniform in a diametrical direction and may have an uneven profile. However, since the plasma is diffused in all directions within the processing space of the chamber 10, a plasma density in a vicinity of the susceptor 12, i.e. on the substrate W, may become very uniform.

In the present embodiment, both of the inner coil 58 and the outer coil 62 have the circular ring shapes. Further, since a regular or uniform high frequency currents flow in the circumferential directions of the coils, a plasma density distribution can constantly be uniformized in the circumferential directions of the coils in the vicinity of the susceptor 12, i.e., on the substrate W as well as within the donut-shaped plasma.

Meanwhile, by maintaining constantly the diameter ratio (1:2) between the inner coil 58 and the outer coil 62 and by adjusting or optimizing the entire diameter of the RF antenna 54, the plasma density distribution in the vicinity of the susceptor 12, i.e., on the substrate W can be adjusted.

In the present embodiment, each of the coils 58 and 62 within the RF antenna 54 include a single or a multiple number of coil segments. When the coil 62 includes the multiple number of coil segments 64(1) and 64(2), those coil segments 64(1) and 64(2) are electrically connected in parallel to each other. In such a configuration, a wavelength effect or a voltage drop within the RF antenna 54 depends on the length of each of the coil segments 60, 64(1) and 64(2).

Accordingly, the length of the inner coil segment 60 of the inner coil 58 and the lengths of the outer coil segments 64(1) and 64(2) of the outer coil 62 may be set so as not to allow the occurrence of the wavelength effect within the individual coil segments 60, 64(1) and 64(2), and also so as not to increase the voltage drop. In this way, the problems of the wavelength effect and voltage drop within the RF antenna 54 can be all resolved. For suppressing the wavelength effect, it may be desirable to set the length of each of the coil segments 60, 64(1) and 64(2) to be shorter (more desirably, much shorter) than about ¼ of a wavelength of the high frequency power $RF_H$.

Figure 3:
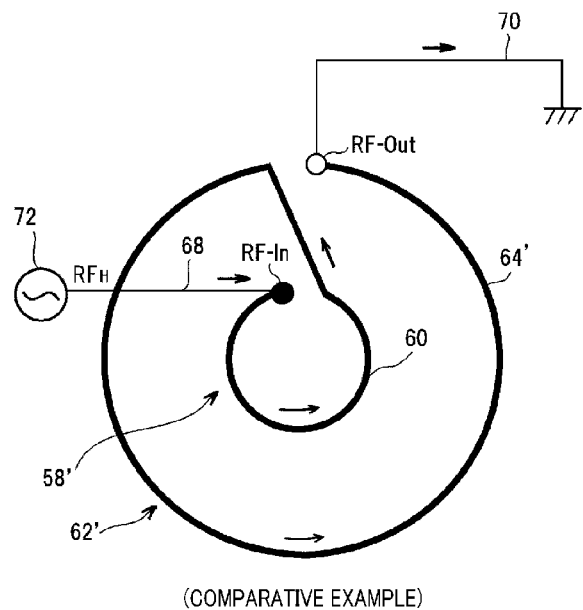
FIG. 3 is a diagram illustrating a basic layout and an electric connection of a RF antenna in accordance with a comparative example.

Further, the effect of reducing the voltage drop within the RF antenna of the present embodiment can be easily verified as compared to a comparative example as shown in FIG. 3. A RF antenna of the comparative example includes circular ring-shaped inner coil 58' and outer coil 62' concentrically arranged at an inner side and an outer side of the RF antenna in a radial direction. Here, the inner coil 58' is the same as the inner coil 58 of the present embodiment and includes a single coil segment 60. The outer coil 62' is, however, different from the outer coil 62 of the present embodiment and includes a single coil segment 64' having a length twice the length of the coil segment 60. Further, in the RF antenna of the comparative example, the inner coil 58' and the outer coil 62' are connected in series to allow high frequency currents having the same magnitude to flow through the inner coil 58' and the outer coil 62'.

In the RF antenna of the comparative example, if inductance of the inner coil 58' (coil segment 60) is, e.g., about 400 nH during plasma generation, the inductance of the outer coil 62' (coil segment 64') is about 800 nH, and the inductance of the entire RF antenna becomes about 1200 nH. Accordingly, if a high frequency current of about 20 A (having a frequency of about 13.56 MHz) flows through each coil of the RF antenna, a potential difference (voltage drop) of about 2 kV is generated within the RF antenna.

Figure 4:
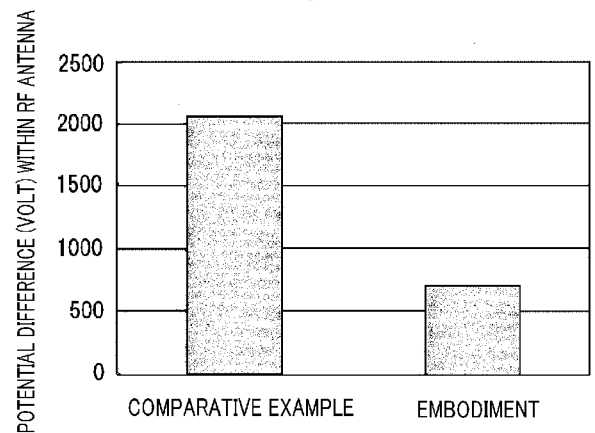
FIG. 4 is a graph comparing potential differences (voltage drops) generated in the RF antenna in accordance with the embodiment and the RF antenna in accordance with the comparative example.

In comparison, in the RF antenna 54 of the present embodiment, if the inductance of the inner coil 58 (inner coil segment 60) is about 400 nH during the plasma generation, the inductance of each of the outer coil segments 64(1) and 64(2) of the outer coil 62 is also about 400 nH, and the inductance of the entire RF antenna becomes about 133 nH. Accordingly, when a high frequency current of about 20 A (having a frequency of about 13.56 MHz) flows through each coil of the RF antenna 54, a potential difference (voltage drop) generated within the RF antenna 54 (i.e., within each coil segment) may be about 680 V, which is equivalent to about ⅓ of the potential difference in the comparative example, as depicted in FIG. 4. Further, in the above calculation for the comparison, impedance of resistance within the RF antenna is ignored for the simplicity of explanation and for the sake of understanding.

As described above, in the RF antenna 54 of the present embodiment, it is difficult for the wavelength effect to occur and the potential difference (voltage drop) generated within the antenna becomes small. Thus, by capacitive coupling between the RF antenna 54 and the plasma, a difference in ion impacts on respective parts of the dielectric window 52 can be reduced. Hence, it is also possible to achieve an effect of reducing an undesirable phenomenon that a part of the dielectric window 52 is locally or intensively etched.

[Experimental Example of Adding Impedance Adjusting Unit to RF Antenna]

Now, a configuration example of adding an impedance adjusting unit to the RF antenna 54 in accordance with the embodiment of the present disclosure will be explained.

Figure 5A:
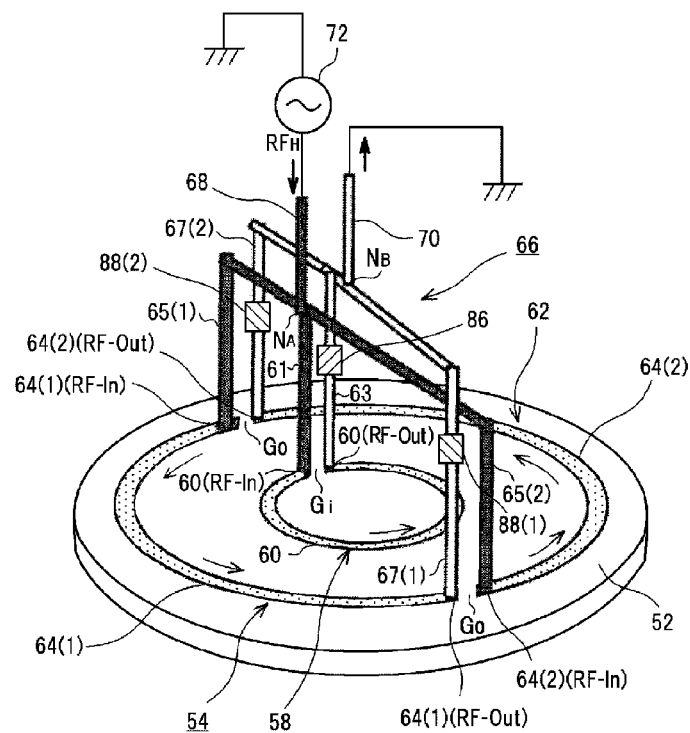
FIG. 5A is a perspective view illustrating a configuration example of adding an impedance adjusting unit to the RF antenna in accordance with the embodiment of the present disclosure.
Figure 5B:
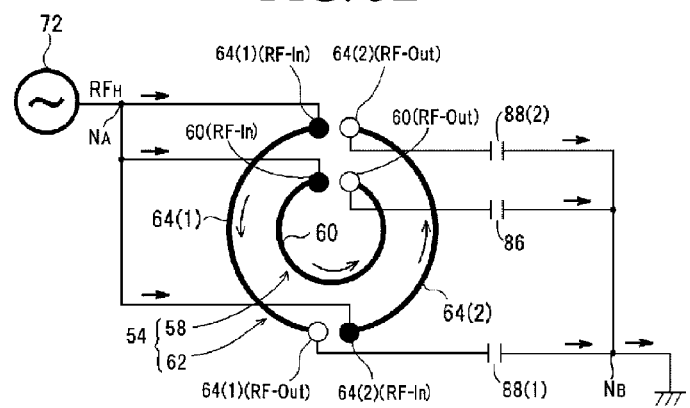
FIG. 5B is an electric connection diagram of the configuration example of FIG. 5A (in case of using a capacitor as the impedance adjusting unit)

As for the RF antenna 54 of the present embodiment, an appropriate example of adding an impedance adjusting unit is illustrated in FIGS. 5A and 5B. As shown therein, between the first node $N_A$ and the second node $N_B$, an individual impedance adjusting unit (e.g., capacitors) 86 is electrically connected to the inner coil segment 60 of the inner coil 58 in series. Further, individual impedance adjusting units (e.g., capacitors) 88(1) and 88(2) are electrically connected to the outer coil segments 64(1) and 64(2) of the outer coil 62 in series. In this case, desirably, the individual impedance adjusting units 86, 88(1) and 88(2) may be connected between the coil segments 60, 64(1) and 64(2) and the second node $N_B$ (i.e., on high frequency power output terminal sides), respectively.

As described above, by connecting the individual impedance adjusting units 86, 88(1) and 88(2) to the respective coil segments 60, 64(1) and 64(2) within the RF antenna 54, impedance of each serial branch circuit can be adjusted. As a result, it may be possible to individually control high frequency currents flowing in the respective coil segments 60, 64(1) and 64(2).

To elaborate, it may be possible to adjust the high frequency currents flowing in the multiple number of outer coil segments 64(1) and 64(2) within the outer coil 62 (typically, to control those high frequency currents to the same level). Further, it may also be possible to adjust a balance (ratio) between the high frequency current flowing in the inner coil 58 and the high frequency current flowing in the outer coil 62.

Moreover, in the above-described configuration example, since all the coil segments 60, 64(1) and 64(2) are electrically terminated through the individual impedance adjusting units (capacitors) 86, 88(1) and 88(2), respectively, electric potentials of the inner coil 58 and the outer coil 62 may become higher than a ground potential. As a result, the capacitive coupling between the RF antenna 54 and the plasma may be weakened, and, thus, it is possible to suppress a sputtering effect causing damage and degradation of the dielectric window 52 by the ion attack from the plasma. Meanwhile, although a length of an equivalent short-circuit resonance line is shortened due to the capacitors 86, 88(1) and 88(2), the wavelength effect may not be caused because a line length of each of the coil segments 60, 64(1) and 64(2) is sufficiently short.

In addition, as the line length of each of the coil segments 60, 64(1) and 64(2) is sufficiently short, self-inductance, i.e., inductive reactance of each of the coil segments is small. Thus, capacitive reactance of each of the individual impedance adjusting units (capacitors) 86, 88(1) and 88(2) for cancelling the inductive reactance can be small. That is, a current split (magnetomotive force balance) between the inner coil 58 and the outer coil 62 can be adjusted by the individual impedance adjusting units (capacitors) 86, 88(1) and 88(2) on the ends having large electrostatic capacitances.

By way of example, if the inductances of the respective coil segments 60, 64(1) and 64(2) are uniform as about 400 nH, the inductive reactance of each of the coil segments with respect to the high frequency power $RF_H$ of about 13.56 MHz for plasma generation is about 34Ω. Here, if the electrostatic capacitances of the individual impedance adjusting units (capacitors) 86, 88(1) and 88(2) are set to be uniform as about 400 pF, the capacitive reactance of each of the individual impedance adjusting units may be about −30Ω, and thus, a combined reactance becomes about 4Ω. If the combined reactance is of such a small value, even a minute difference in the electrostatic capacitances of the individual impedance adjusting units (capacitors) 86, 88(1) and 88(2) may cause a great difference in electric currents.

Meanwhile, if the electrostatic capacitances of the individual impedance adjusting units (capacitors) 86, 88(1) and 88(2) are set to be about 1000 pF, the capacitive reactance of each individual impedance adjusting unit is about −12Ω, and thus, a combined reactance becomes about 22Ω. If the combined reactance is of such a large value, there may be generated no great difference in the electric currents flowing in the respective coil segments 60, 64(1) and 64(2) even if there is a difference of several percentage between the electrostatic capacitances of the individual impedance adjusting units (capacitors) 86, 88(1) and 88(2). In this way, by using the individual impedance adjusting units (capacitors) 86, 88(1) and 88(2) having large electrostatic capacitances, the current split (magnetomotive force balance) between the inner coil 58 and the outer coil 62 can be stably controlled.

In the configuration example shown in FIGS. 5A and 5B, at least one of the inner individual impedance adjusting unit 86 and the outer individual impedance adjusting unit 88(1) (88(2)) may include a variable capacitor appropriately. By way of example, the inner individual impedance adjusting unit 86 connected to the inner coil segment 60 may be a fixed capacitor, while both of the outer individual impedance adjusting units 88(1) and 88(2) respectively connected to the outer coil segments 64(1) and 64(2) may be variable capacitors. Alternatively, the inner individual impedance adjusting unit 86 may be a variable capacitor, while both of the outer individual impedance adjusting units 88(1) and 88(2) may be fixed capacitors. Further alternatively, the inner individual impedance adjusting unit and both of the outer individual impedance adjusting units 88(1) and 88(2) may be all variable capacitors.

In any of the above-mentioned cases, not only the flowing directions of the currents but also the current magnitudes are required to be set to be same between the multiple number of outer individual coil segments 64(1) and 64(2) of the single (outer) coil 62. Thus, in principle, it is not acceptable that only one of the outer individual impedance adjusting units 88(1) and 88(2) includes a variable capacitor. That is, desirably, all the individual impedance adjusting units 88(1) and 88(2) need to be either variable capacitors or fixed capacitors having the same electrostatic capacitance.

In the configuration example of FIGS. 5A and 5B, if the frequency of the high frequency power $RF_H$ for plasma generation is about 13.56 MHz and the inductance of each of the coil segments 60, 64(1) and 64(2) is about 400 nH, a combined reactance (substantial combined impedance) is about 14.5Ω (fixed value) and a current of about 11.7 A (fixed value) flows in a serial branch circuit when the electrostatic capacitance of the inner individual impedance adjusting unit (capacitor) 86 is set to be about 600 pF (fixed value). The serial branch circuit includes the inner coil segment 60 and the inner individual impedance adjusting unit (capacitor) 86.

Figures 6, 7:
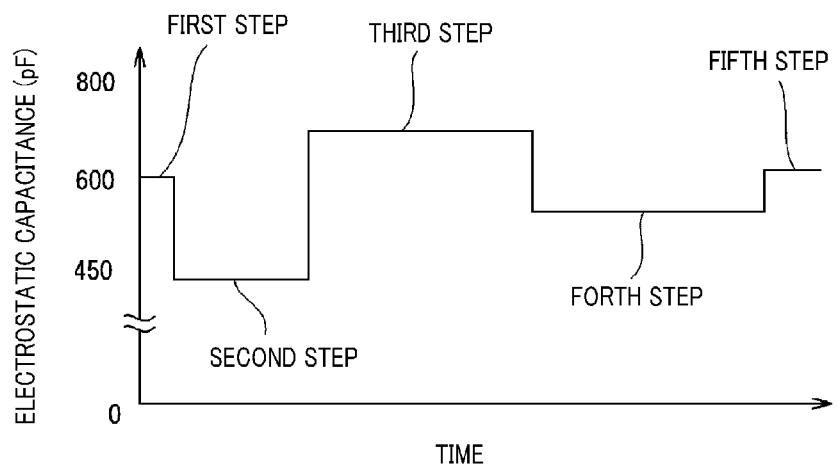
FIG. 6 is a table showing impedance and current magnitudes in series circuits between respective outer coil segments and respective outer individual capacitors when electrostatic capacitance of a variable capacitor is varied in the configuration example of FIGS. 5A and 5B.
FIG. 7 is a diagram for describing a method for varying electrostatic capacitance of an outer individual impedance adjusting unit (variable capacitor) in a multi-step plasma process by using the configuration example of FIGS. 5A and 5B.

Meanwhile, if the electrostatic capacitances of the outer individual impedance adjusting units (capacitors) 88(1) and 88(2) are set to be same and varied from about 450 pF to about 1200 pF gradually, the combined reactance (substantial combined reactance) and the current are varied as shown in FIG. 6 in each of the serial branch circuits including the outer coil segments 64(1) and 64(2) and the outer individual impedance adjusting units (capacitors) 88(1) and 88(2), respectively.

That is, if the electrostatic capacitances of the outer individual impedance adjusting units (capacitors) 88(1) and 88(2) are set to be about 450 pF, a current (about 21.3 A) twice as high as a current flowing through the inner coil 58 (inner coil segment 60) can flow through the outer coil 62 (outer coil segments 64(1) and 64(2)). Further, if the electrostatic capacitances of the outer individual impedance adjusting units (capacitors) 88(1) and 88(2) are set to be about 600 pF, a current (about 11.7 A) of the same level as that flowing through the inner coil 58 (inner coil segment 60) can flow through the outer coil 62 (outer coil segments 64(1) and 64(2)). Furthermore, if the electrostatic capacitances of the outer individual impedance adjusting units (capacitors) 88(1) and 88(2) are set to be about 1200 pF, a current (about 7.0 A) equivalent to about ½ of the current flowing through the inner coil 58 (inner coil segment 60) can flow through the outer coil 62 (outer coil segments 64(1) and 64(2)).

In this way, by variably adjusting the ratio of the currents flowing in the inner coil 58 and the outer coil 62, the magnetomotive force balance between the two coils 58 and can be controlled. In addition, the plasma density distribution in the vicinity of the susceptor 12, i.e., on the semiconductor wafer W can be controlled as desired in various manners.

In the inductively coupled plasma etching apparatus in accordance with the present embodiment, the above-described individual impedance adjusting units 86, 88(1) and 88(2) are added to the RF antenna 54. This inductively coupled plasma etching apparatus can be appropriately used in an application that accompanies change, variation or switchover of a processing condition (pressure, gas system, or the like) during a plasma process on a single sheet of semiconductor wafer W. By way of example, the plasma etching apparatus can be appropriately used in, e.g., an application for continuously etching multiple layers on a wafer surface in a multiple number of processing steps.

That is, in a multi-step plasma process, as illustrated in FIG. 7, by changing the electrostatic capacitances of the outer individual impedance adjusting units 88(1) and 88(2) so as to be suitable for processing conditions for every step (process), it is possible to control the plasma density distribution in the vicinity of the susceptor 12, i.e., on the wafer W to a desired profile (e.g., substantially flat profile) through all of the steps involved. Further, it is possible to improve uniformity of the plasma process both in the circumferential direction and in the radial direction.

In addition, in the configuration example shown in FIGS. 5A and 5B, the outer individual impedance adjusting units 88(1) and 88(2) are respectively coupled to the two outer coil segments 64(1) and 64(2) of the outer coil 62. Thus, by controlling the impedances of the outer individual impedance adjusting units 88(1) and 88(2) to be slightly different from each other, it may be also possible to correct a deviation in the circumferential direction that might be caused by a difference between the plasma processing apparatuses.

Figure 8A:
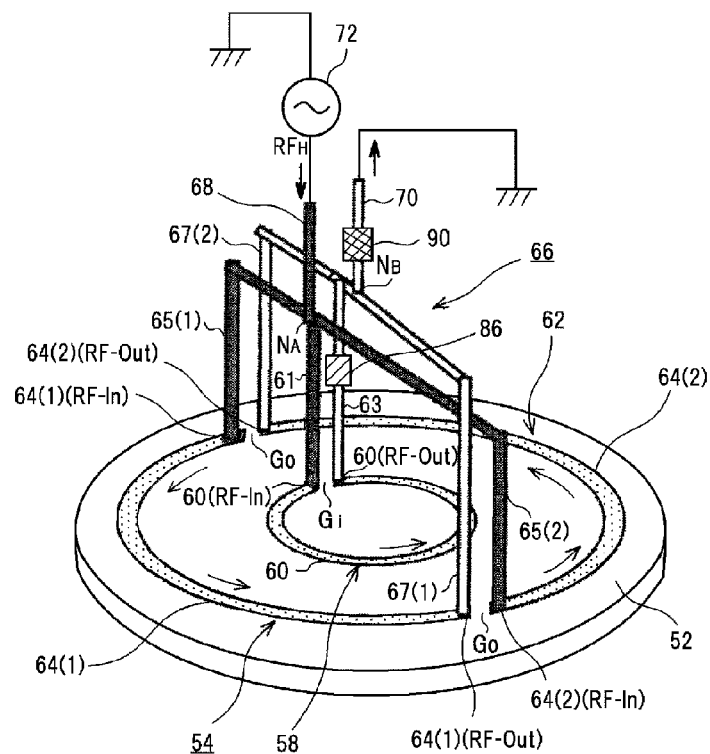
FIG. 8A is a perspective view illustrating another configuration example of adding an impedance adjusting unit to the RF antenna in accordance with the embodiment of the present disclosure.

FIGS. 8A (8B) and 9A (9B) illustrate another configuration example of adding an impedance adjusting unit to the RF antenna 54 of the present embodiment.

Figure 8B:
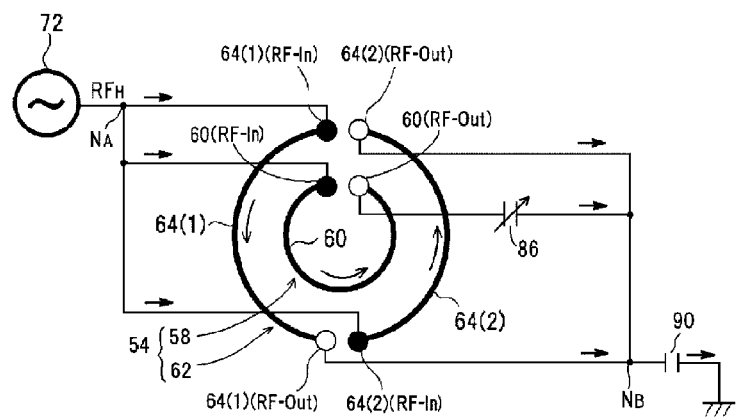
FIG. 8B is an electric connection diagram of the configuration example of FIG. 8A (in case of using a variable capacitor as an inner individual impedance adjusting unit)

In the configuration example shown in FIGS. 8A and 8B, between the first and second nodes $N_A$ and $N_B$, an inner individual impedance adjusting unit (e.g., capacitor) 86 is coupled to the inner coil segment 60 of the inner coil 58, whereas no impedance adjusting unit is coupled to the outer coil segments 64(1) and 64(2) of the outer coil 62. Desirably, the inner individual impedance adjusting unit 86 may be a variable capacitor. However, it may be a fixed capacitor.

Figure 9A:
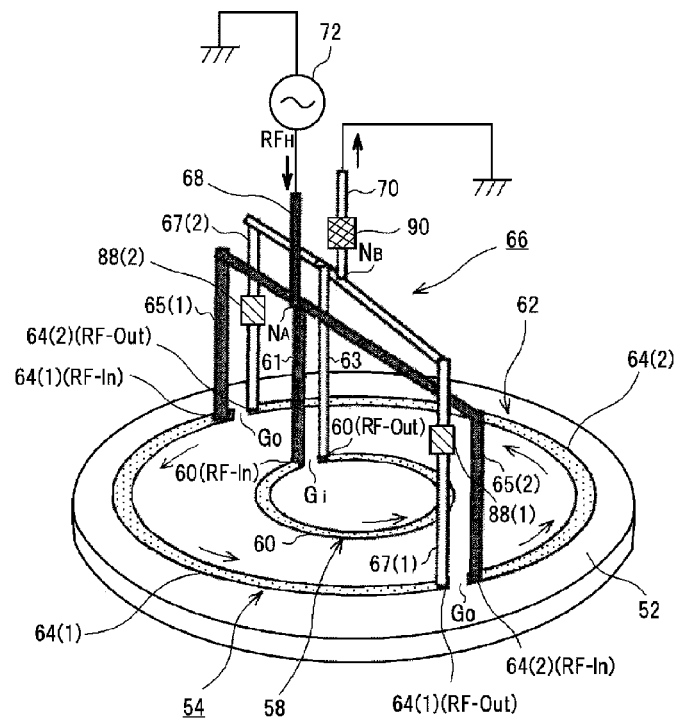
FIG. 9A is a perspective view illustrating another configuration example of adding an impedance adjusting unit to the RF antenna in accordance with the embodiment of the present disclosure.
Figure 9B:
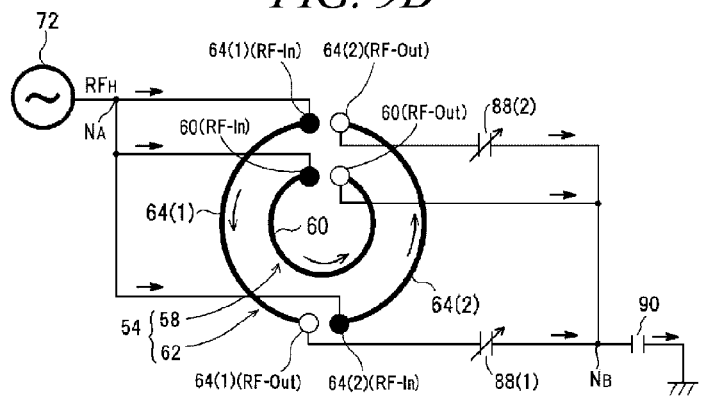
FIG. 9B is an electric connection diagram of the configuration example of FIG. 9A (in case of using a variable capacitor as an outer impedance adjusting unit)

In the configuration example shown in FIGS. 9A and 9B, between the first and second nodes $N_A$ and $N_B$, outer individual impedance adjusting units 88(1) and 88(2) are electrically connected in series to the outer coil segments 64(1) and 64(2) of the outer coil 62, whereas no impedance adjusting unit is connected to the inner coil segment 60 of the inner coil 58. Desirably, outer individual impedance adjusting units 88(1) and 88(2) may be variable capacitors. However, they may be fixed capacitors.

As for a function of adjusting a balance (ratio) between the high frequency currents flowing in the inner coil 58 and the outer coil 62, it may be possible to omit the inner individual impedance adjusting unit 86 or to omit one of the outer individual impedance adjusting units 88(1) and 88(2). Here, it is notable again that not only the direction of the high frequency currents but also the current magnitudes need to be same between the multiple number of (two) coil segments 64(1) and 64(2) of the single (outer) coil 62. Thus, in principle, it is required to avoid a configuration in which the individual impedance adjusting unit is connected to either one of the two coil segments 64(1) and 64(2). That is, variable capacitors may be connected to both of the coil segments 64(1) and 64(2), or fixed capacitors may be connected to both of the coil segments 64(1) and 64(2).

Moreover, as depicted in FIG. 8A (8B) and FIG. 9A (9B), provided on an end of the RF antenna 54, i.e., between the second node $N_B$ and the earth line 70 (or on the earth line 70) is an output side common impedance adjusting unit (e.g., a capacitor) 90 electrically connected in series to all the coil segments 60, 64(1) and 64(2) within the RF antenna 54. Although the output side (end) common impedance adjusting unit 90 may be typically a fixed capacitor, it may also be a variable capacitor.

The output side (end) common impedance adjusting unit 90 has a function of adjusting the entire impedance of the RF antenna 54. Further, when a capacitor is used as the output side (termination end) common impedance adjusting unit 90, it also has a function of suppressing ion sputtering on the ceiling plate or the dielectric window 52 by increasing the entire electric potential (DC) of the RF antenna 54 from a ground potential.

Figure 10A:
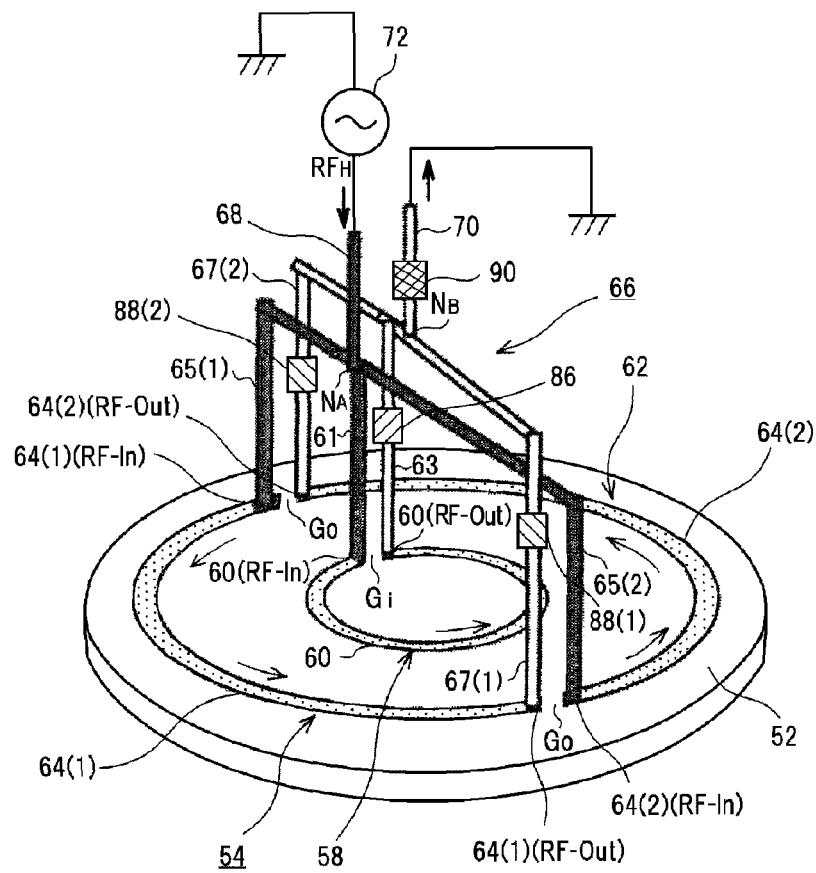
FIG. 10A is a perspective view illustrating another configuration example of adding an impedance adjusting unit to the RF antenna in accordance with the embodiment of the present disclosure.

The output side (end) common impedance adjusting unit 90 may also be applicable to a configuration in which the individual impedance adjusting units 86, 88(1) and 88(2) are connected to the inner coil segment 60 and the outer coil segments 64(1) and 64(2), respectively, as illustrated in FIG. 10A.

Figure 10B:
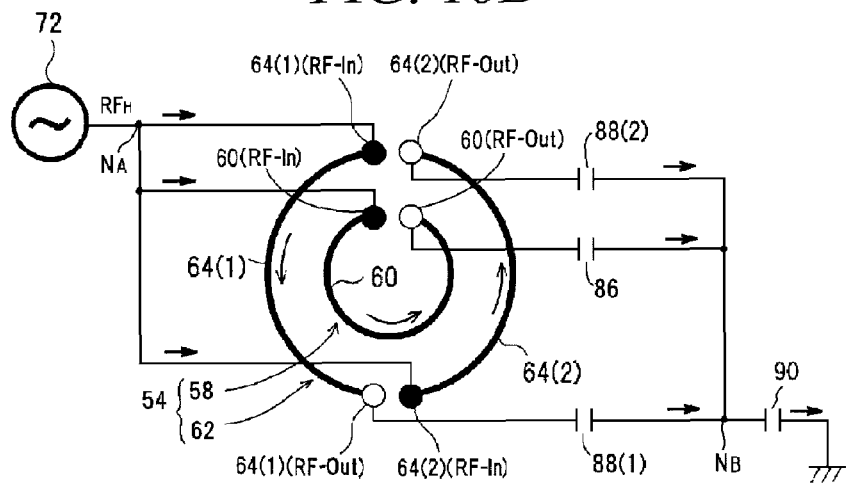
FIG. 10B is an electric connection diagram of the configuration example of FIG. 10A (in case of using a fixed capacitor as an inner individual impedance adjusting unit and also using a fixed capacitor as an outer individual impedance adjusting unit)
Figure 10C:
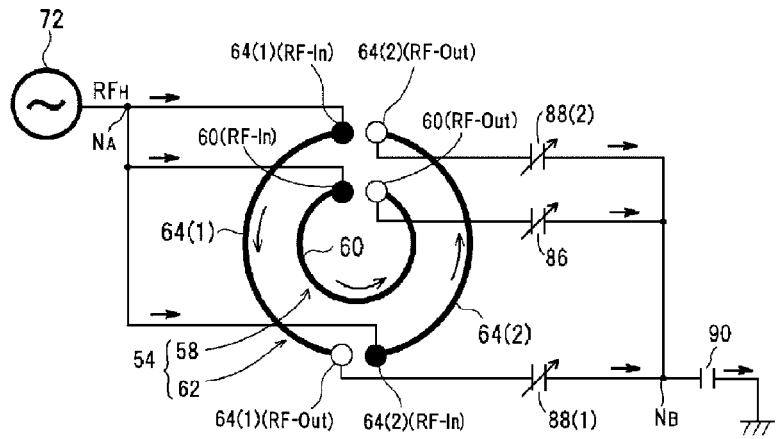
FIG. 10C is an electric connection diagram of the configuration example of FIG. 10A (in case of using a variable capacitor as an inner individual impedance adjusting unit and also using a variable capacitor as an outer individual impedance adjusting unit)
Figure 10D:
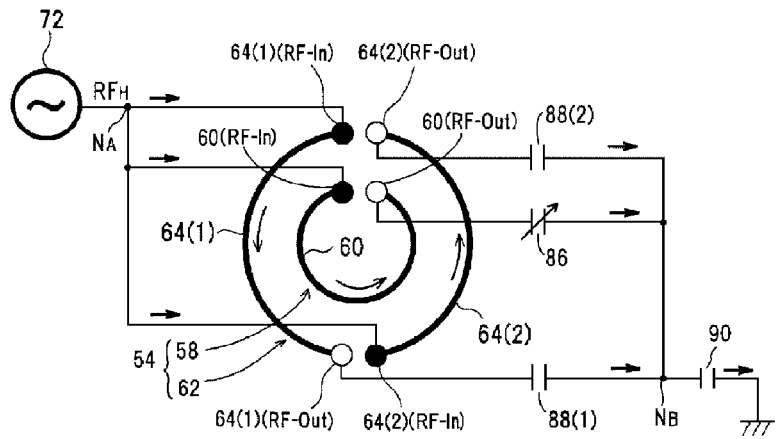
FIG. 10D is an electric connection diagram of the configuration example of FIG. 10A (in case of using a variable capacitor as an inner individual impedance adjusting unit while using a fixed capacitor as an outer individual impedance adjusting unit)
Figure 10E:
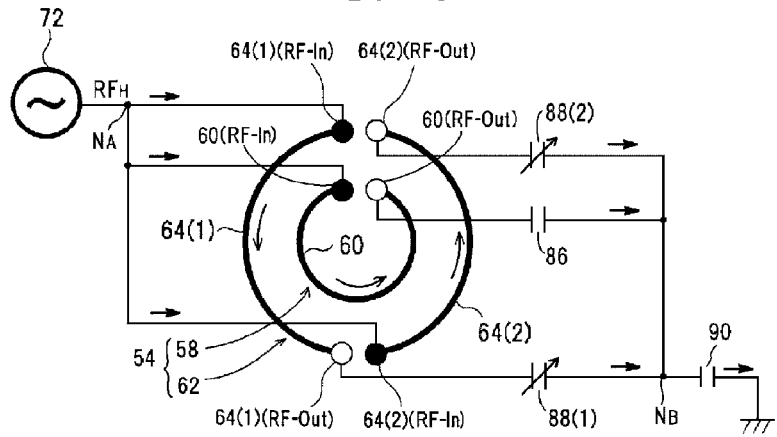
FIG. 10E is an electric connection diagram of the configuration example of FIG. 10A (in case of using a fixed capacitor as an inner individual impedance adjusting unit while using a variable capacitor as an outer individual impedance adjusting unit)

In such a case, all of the individual impedance adjusting units 86, 88(1) and 88(2) may be fixed capacitors, as illustrated in FIG. 10B. Alternatively, as depicted in FIG. 10C, the inner individual impedance adjusting unit 86 may be a variable capacitor, while both of the outer individual impedance adjusting units 88(1) and 88(2) may be variable capacitors. Further alternatively, as depicted in FIG. 10D, the inner individual impedance adjusting unit 86 may be a variable capacitor, while both of the outer individual impedance adjusting units 88(1) and 88(2) may be fixed capacitors. Still further alternatively, as shown in FIG. 10E, the inner individual impedance adjusting unit 86 may be a fixed capacitor, while both of the outer individual impedance adjusting units 88(1) and 88(2) are variable capacitors.

Figure 11A:
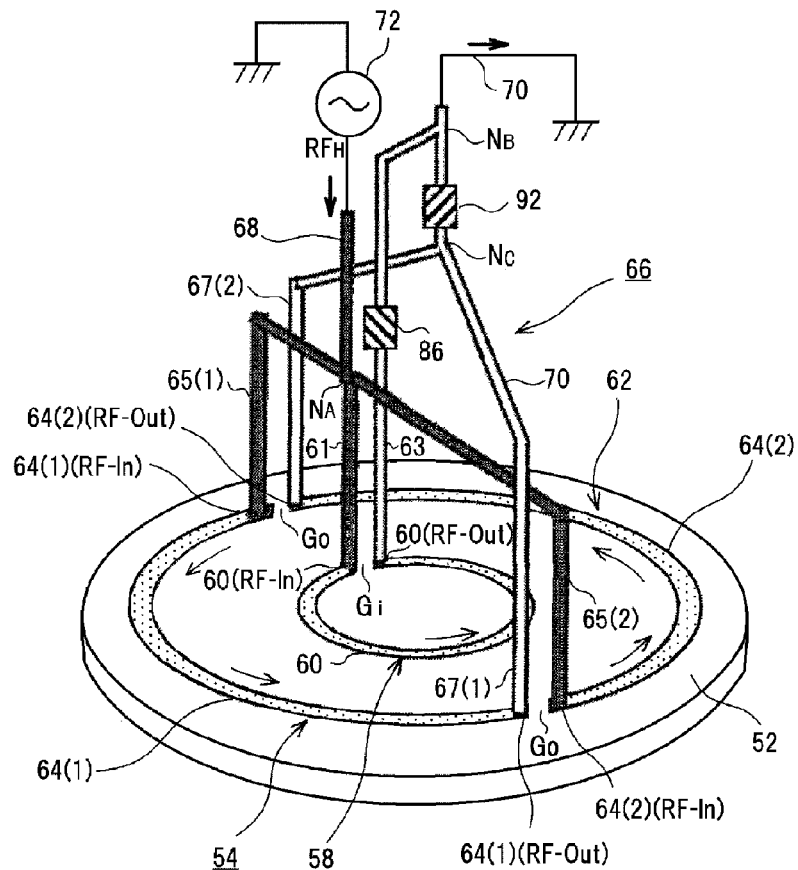
FIG. 11A is a perspective view illustrating another configuration example of adding an impedance adjusting unit to the RF antenna in accordance with the embodiment of the present disclosure.

FIG. 11A illustrates another configuration example of adding a capacitor to the RF antenna 54. In this configuration example, between the first node $N_A$ and the second node $N_B$, an inner individual impedance adjusting unit 86 is connected in series to the inner coil segment 60 of the inner coil 58, while an outer common impedance adjusting unit 92 connected in series to both of the outer coil segments 64(1) and 64(2) of the outer coil 62. Further, the outer common impedance adjusting unit 92 is connected in parallel to the inner coil segment 60.

To elaborate, there is provided a third node $N_C$ between the first node $N_A$ and the second node $N_B$. The outer coil segments 64(1) and 64(2) are connected in parallel between the first node $N_A$ and the third node $N_C$; the inner coil segment 60 and the inner individual impedance adjusting unit 86 are connected in series between the first node $N_A$ and the second node $N_B$; and the outer common impedance adjusting unit 92 is connected between the third node $N_C$ and the second node $N_B$.

Figure 11B:
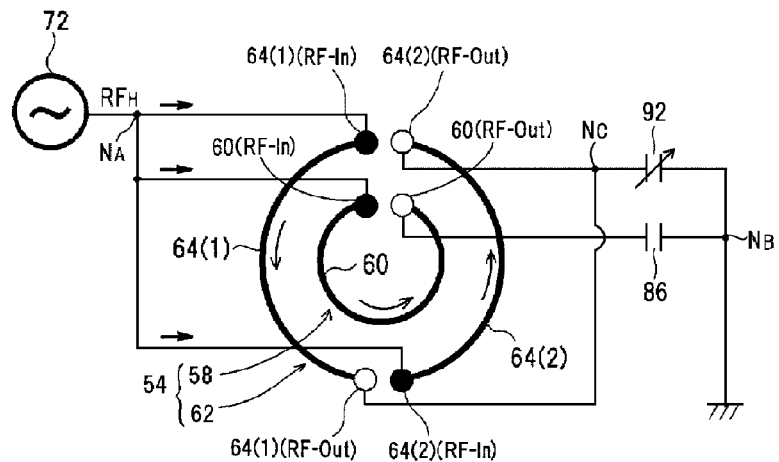
FIG. 11B is an electric connection diagram of the configuration example of FIG. 11A (in case of using a fixed capacitor as an inner individual impedance adjusting unit while using a variable capacitor as an outer common impedance adjusting unit)
Figures 12, 13:
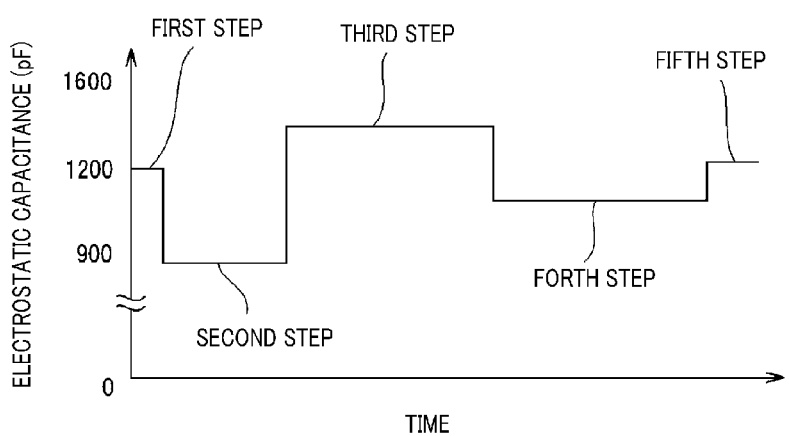
FIG. 12 is a table showing impedance and current magnitudes in a series circuit between an outer coil segment and the outer common impedance adjusting unit when electrostatic capacitance of the outer common impedance adjusting unit (variable capacitor) is varied in the configuration example of FIGS. 11A and 11B.
FIG. 13 is a diagram for describing a method for varying the electrostatic capacitance of the outer common impedance adjusting unit (variable capacitor) in a multi-step plasma process in accordance with the configuration example of FIGS. 11A and 11B.

In this configuration, by way of example, as illustrated in FIG. 11B, the inner individual impedance adjusting unit 86 may be a fixed capacitor, while the outer common impedance adjusting unit 92 may be a variable capacitor. Further, as depicted in FIGS. 12 and 13, by setting electrostatic capacitance (variable range) of the outer common impedance adjusting unit (capacitor) 92 to be twice the electrostatic capacitance (variable range) of the outer individual impedance adjusting units (capacitors) 88(1) and 88(2), the same adjusting function as described in the configuration example shown in FIG. 5A can also be achieved.

In this way, in order to achieve a balance between the high frequency currents flowing in the inner coil 58 and the outer coil 62, the outer common impedance adjusting unit 92 has a function of adjusting the entire impedance of the outer coil 62 (outer coil segments 64(1) and 64(2)). Furthermore, when there is provided no output side (end) common impedance adjusting unit (capacitor) 90, the outer common impedance adjusting unit 92 may also be substituted for the common impedance adjusting unit 90.

Figure 14A:
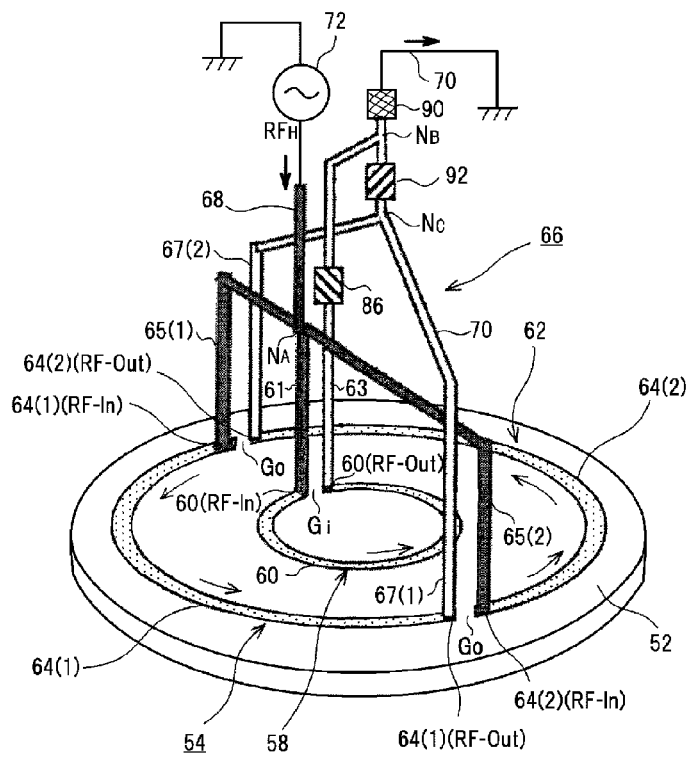
FIG. 14A is a perspective view illustrating another configuration example of adding an impedance adjusting unit to the RF antenna in accordance with the embodiment of the present disclosure.

Moreover, as depicted in FIG. 14A, the outer common impedance adjusting unit 92 and the output side (end) common impedance adjusting unit 90 may be provided together. In such a case, it is possible to achieve a combined effect of the function of the outer common impedance adjusting unit 92 and the output side (end) common impedance adjusting unit 90.

Figure 14B:
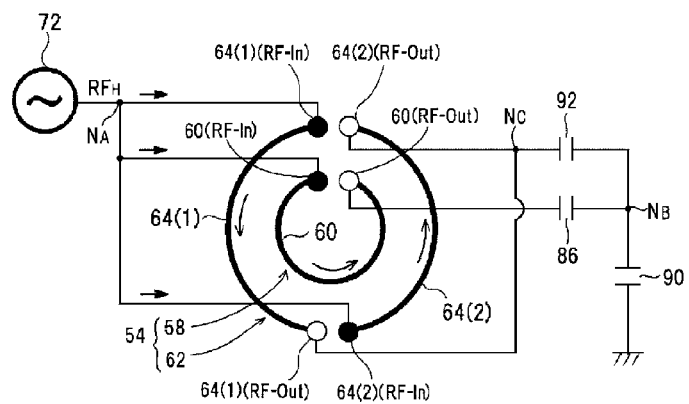
FIG. 14B is an electric connection diagram of the configuration example of FIG. 14A (in case of using a fixed capacitor an inner individual impedance adjusting unit and also using as a fixed capacitor as an outer common impedance adjusting unit)
Figure 14C:
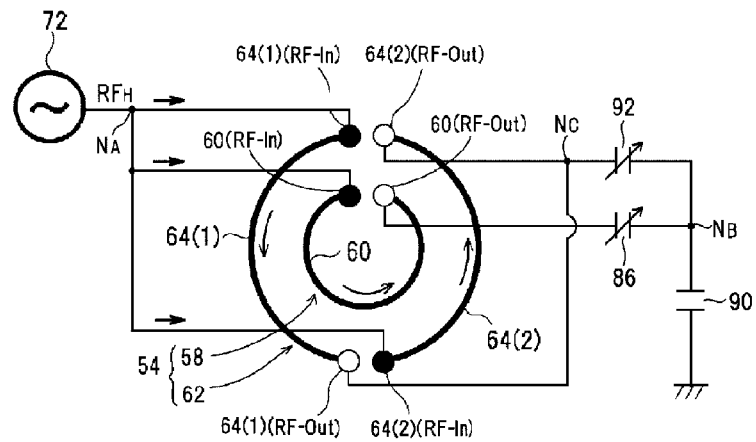
FIG. 14C is an electric connection diagram of the configuration example of FIG. 14A (in case of using a variable capacitor as an inner individual impedance adjusting unit and also using a variable capacitor as the outer common impedance adjusting unit)
Figure 14D:
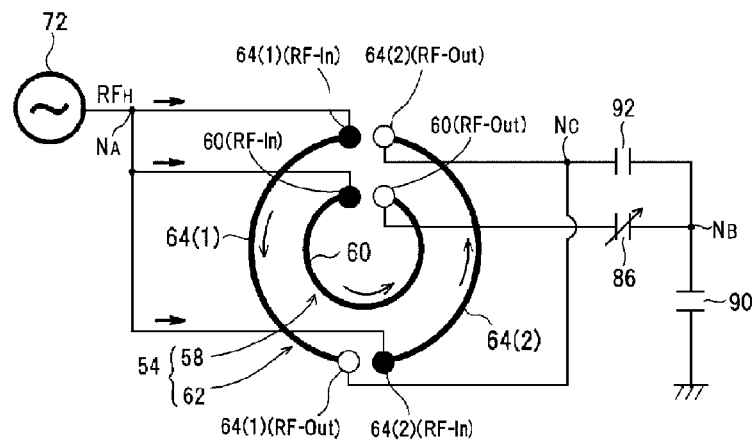
FIG. 14D is an electric connection diagram of the configuration example of FIG. 14A (in case of using a variable capacitor as an inner individual impedance adjusting unit while using as a fixed capacitor as the outer common impedance adjusting unit)
Figure 14E:
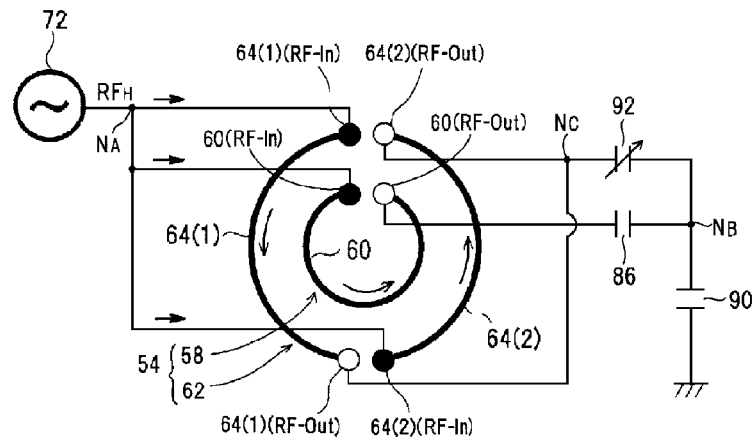
FIG. 14E is an electric connection diagram of the configuration example of FIG. 14A (in case of using a fixed capacitor as an inner individual impedance adjusting unit while using a variable capacitor as the outer common impedance adjusting unit)

In this configuration example, the inner individual impedance adjusting unit 86 may be a fixed capacitor, while the outer common impedance adjusting unit 92 may be a fixed capacitor, as illustrated in FIG. 14B. Alternatively, as depicted in FIG. 14C, the inner individual impedance adjusting unit 86 may be a variable capacitor, while the outer common impedance adjusting unit 92 may be a variable capacitor. Further alternatively, as shown in FIG. 14D, the inner individual impedance adjusting unit 86 may be a variable capacitor, while the outer common impedance adjusting unit 92 may be a fixed capacitor. Still further alternatively, as illustrated in FIG. 14E, the inner individual impedance adjusting unit 86 may be a fixed capacitor, while the outer common impedance adjusting unit 92 is a variable capacitor.

Figure 15A:
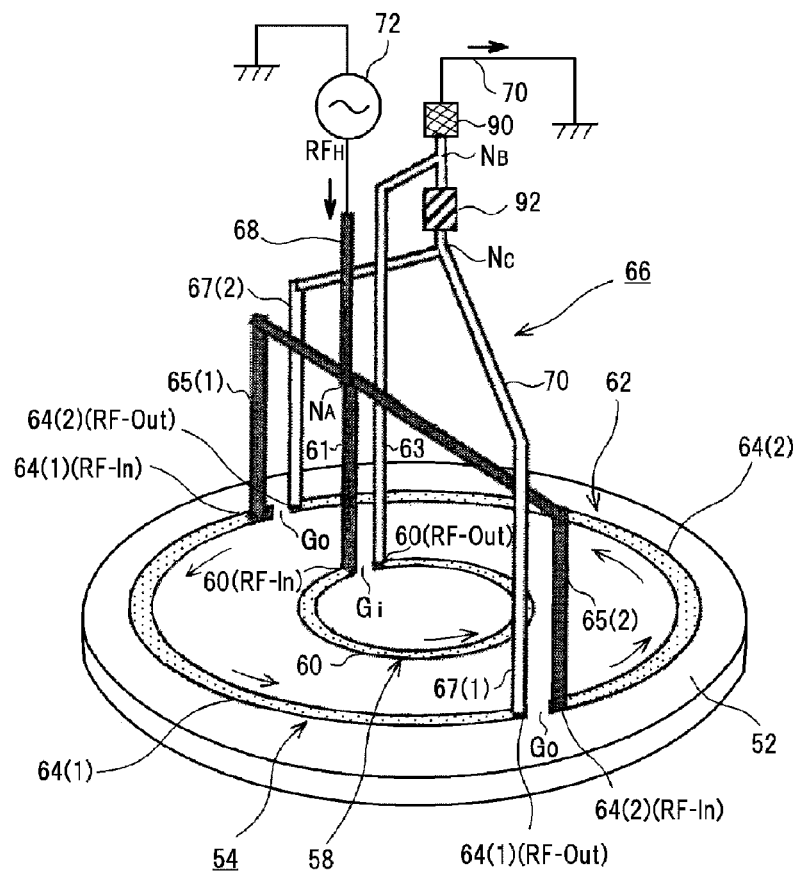
FIG. 15A is a perspective view illustrating another configuration example of adding an impedance adjusting unit to the RF antenna in accordance with the embodiment of the present disclosure.
Figure 15B:
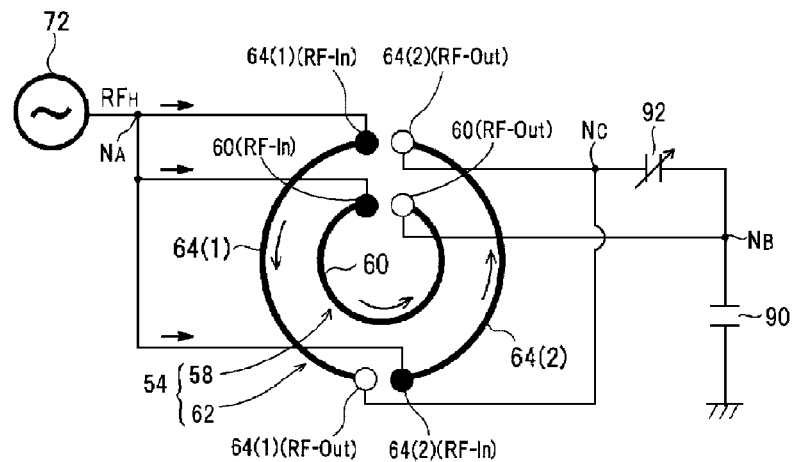
FIG. 15B is an electric connection diagram corresponding to the configuration example of FIG. 15A (in case of using a variable capacitor as an outer common impedance adjusting unit)

Referring to FIGS. 15A and 15B, there is illustrated another configuration example of adding an outer common impedance adjusting unit 92 to the RF antenna 54. The outer common impedance adjusting unit (e.g., a capacitor) 92 may be connected to the outer coil 62, while no impedance adjusting unit is connected to the inner coil 58.

Figure 16A:
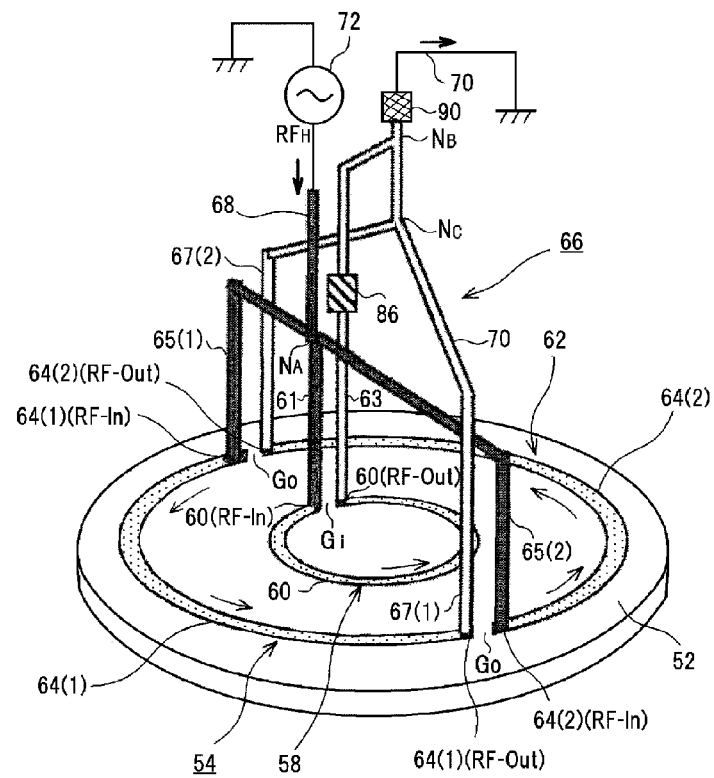
FIG. 16A is a perspective view illustrating another configuration example of adding an impedance adjusting unit to the RF antenna in accordance with the embodiment of the present disclosure.
Figure 16B:
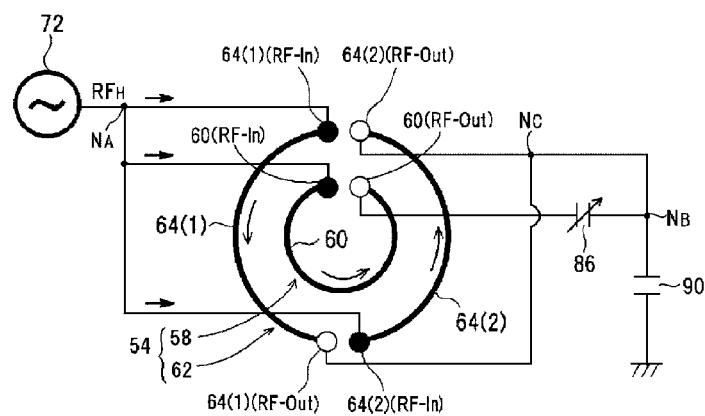
FIG. 16B is an electric connection diagram corresponding to the configuration example of FIG. 16a (in case of using a variable capacitor as an inner individual impedance adjusting unit)
Figure 17A:
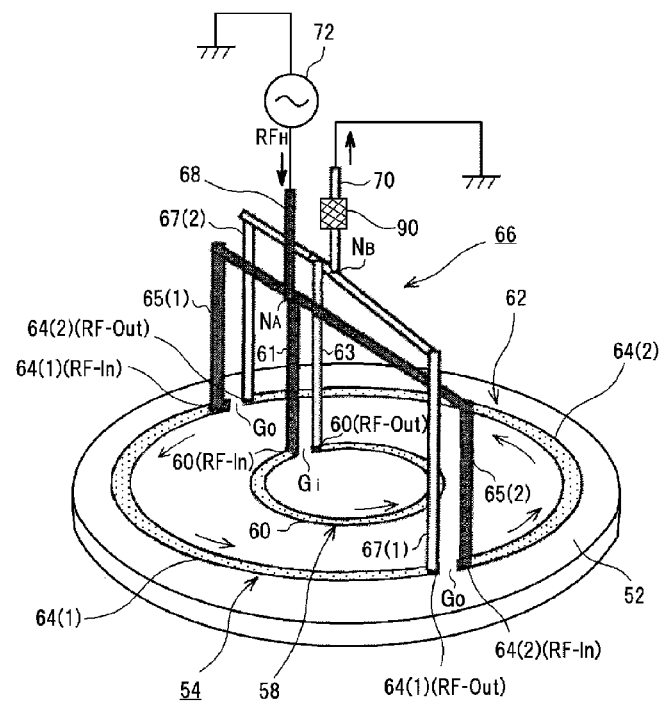
FIG. 17A is a perspective view illustrating another configuration example of adding an impedance adjusting unit to the RF antenna in accordance with the embodiment of the present disclosure.
Figure 17B:
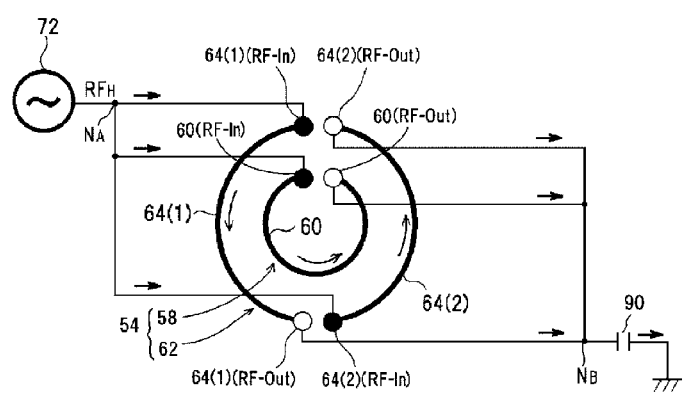
FIG. 17B is an electric connection diagram corresponding to the configuration example of FIG. 17A (in case of using a variable capacitor as an output side common impedance adjusting unit)
Figure 18A:
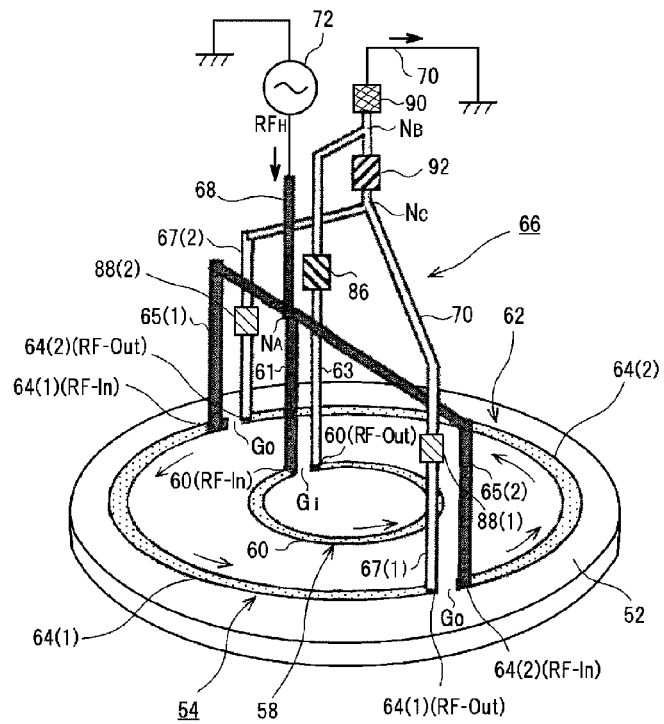
FIG. 18A is a perspective view illustrating another configuration example of adding an impedance adjusting unit to the RF antenna in accordance with the embodiment of the present disclosure.
Figure 18B:
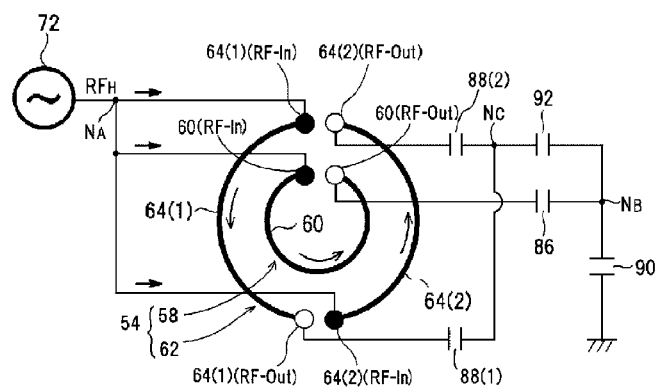
FIG. 18B is an electric connection diagram corresponding to the configuration example of FIG. 18A (in case of using a fixed capacitor as an inner individual impedance adjusting unit and also using fixed capacitors as an outer individual impedance varying unit and an outer common impedance adjusting unit)

Alternatively, as shown in FIGS. 16A and 16B, an inner individual impedance adjusting unit (e.g., a variable capacitor) 86 may be connected to the inner coil 58, while no impedance adjusting unit is connected to the outer coil 62. Further alternatively, as shown in FIGS. 17A and 17B, neither an individual impedance adjusting unit nor an outer (inner) common impedance adjusting unit may be connected to the inner coil 58 and the outer coil 62. Still further alternatively, as shown in FIGS. 18A and 18B, it may be also possible that an inner individual impedance adjusting unit (e.g., a fixed capacitor) 86 is connected to the inner coil (inner coil segment 60), while outer individual impedance adjusting units (e.g., fixed capacitors) 88(1) and 88(2) and an outer common impedance adjusting unit (e.g., a fixed capacitor) 92 are connected to the outer coil 62 (outer coil segments 64(1) and 64(2)).

Figure 19A:
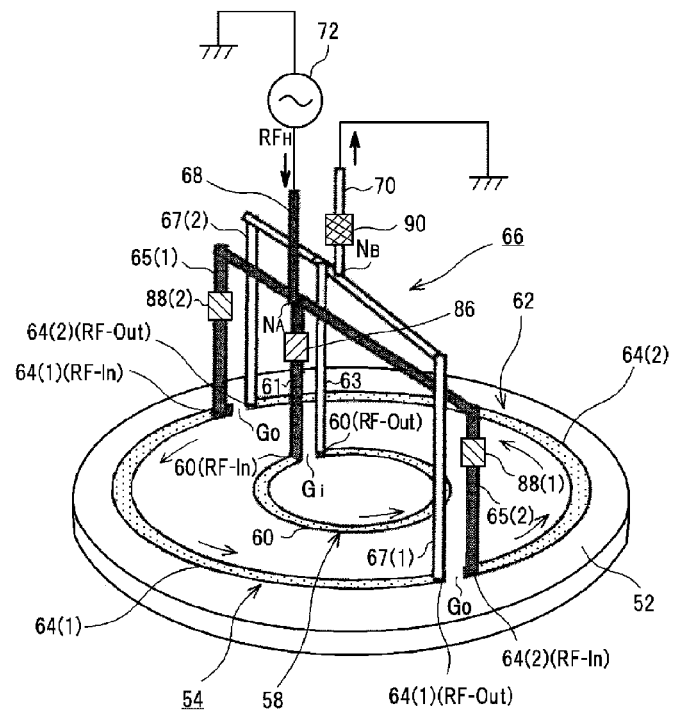
FIG. 19A is a perspective view illustrating another configuration example of adding an impedance adjusting unit to the RF antenna in accordance with the embodiment of the present disclosure.

FIG. 19A shows a configuration example of providing individual impedance adjusting units 86, 88(1) and 88(2) connected to the coil segments 60, 64(1) and 64(2) within the RF antenna 54 on a high frequency input terminal. In this case, in order to increase the entire electric potential (DC) of the RF antenna 54 from a ground potential (in order to suppress ion sputtering on the ceiling plate or the dielectric window 52), it may be desirable to provide an output side (end) common impedance adjusting unit (capacitor) 90 together.

Figure 19B:
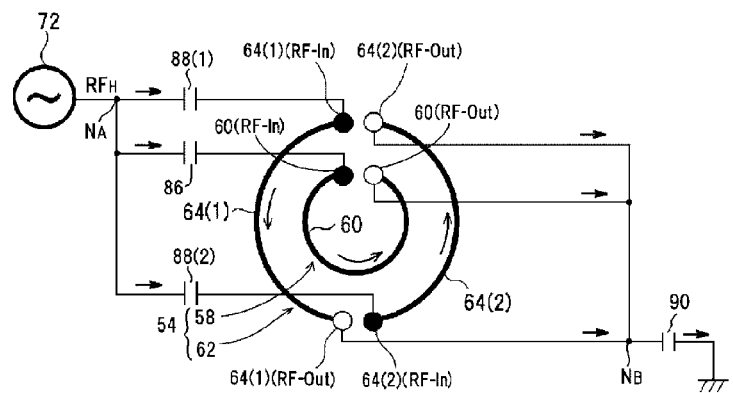
FIG. 19B is an electric connection diagram corresponding to the configuration example of FIG. 19A (in case of using a fixed capacitor as an inner individual impedance adjusting unit and also using a fixed capacitor as an outer individual impedance adjusting unit)
Figure 19C:
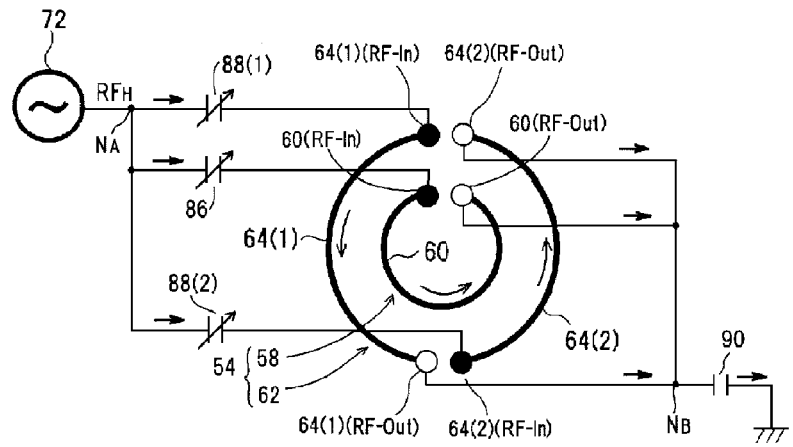
FIG. 19C is an electric connection diagram corresponding to the configuration example of FIG. 19A (in case of using a variable capacitor as an inner individual impedance adjusting unit and also using a variable capacitor as an outer individual impedance adjusting unit as)
Figure 19D:
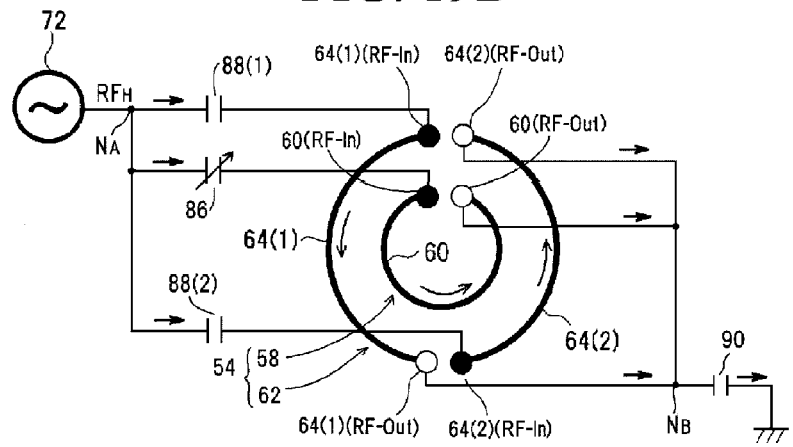
FIG. 19D is an electric connection diagram corresponding to the configuration example of FIG. 19A (in case of using a variable capacitor as an inner individual impedance adjusting unit while using a fixed capacitor as an outer individual impedance adjusting unit)
Figure 19E:
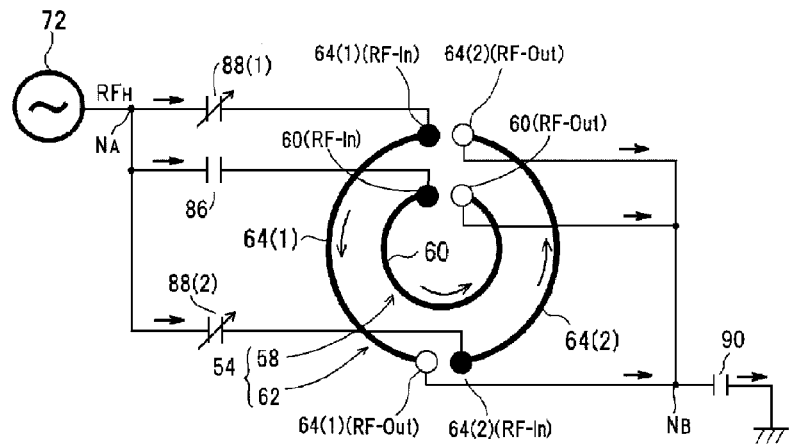
FIG. 19E is an electric connection diagram corresponding to the configuration example of FIG. 19A (in case of using a fixed capacitor as an inner individual impedance adjusting unit while using a variable capacitor as an outer individual impedance adjusting unit)

In the above-described configuration in which the individual impedance adjusting units 86, 88(1) and 88(2) are provided on the high frequency input terminal, as shown in FIG. 19B, the inner individual impedance adjusting unit 86 may be a fixed capacitor and the outer individual impedance adjusting units 88(1) and 88(2) may be also fixed capacitors. Alternatively, as shown in FIG. 19C, the inner individual impedance adjusting unit 86 may be a variable capacitor and the outer individual impedance adjusting units 88(1) and 88(2) are also variable capacitors. Further alternatively, as illustrated in FIG. 19D, the inner individual impedance adjusting unit 86 may be a variable capacitor, while the outer individual impedance adjusting units 88(1) and 88(2) may be fixed capacitors. Still further alternatively, as shown in FIG. 19E, the inner individual impedance adjusting unit 86 may be a fixed capacitor, while the outer individual impedance adjusting units 88(1) and 88(2) may be variable capacitors.

Moreover, in the present disclosure, the impedance adjusting unit added to the RF antenna may not be limited to the fixed capacitor or the variable capacitor as described above. By way of example, the impedance adjusting unit may be a coil or an inductor, or may include a capacitor and an inductor. Alternatively, the impedance adjusting unit may include a resistor element.

[Another Embodiment or Modification Example of RF Antenna]

Figure 20:
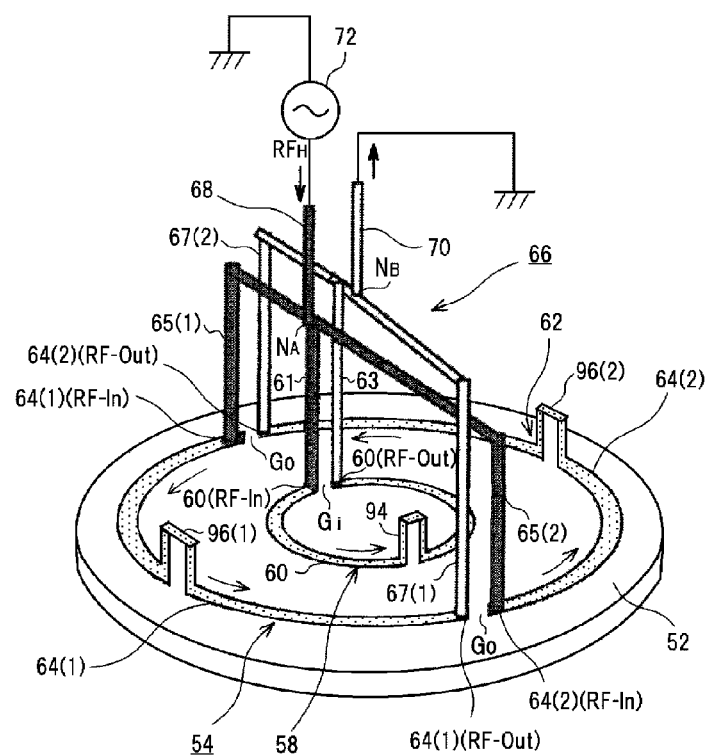
FIG. 20 is a perspective view illustrating a configuration example of forming a protrusion for a dummy gap at a coil segment of the RF antenna in accordance with the embodiment of the present disclosure.

FIG. 20 illustrates a configuration example of providing, e.g., Π-shaped protrusions 94, 96(1) and 96(2) at midway positions of the coil segments 60, 64(1) and 64(2) within the RF antenna 54, respectively. A distance from the dielectric window 52 locally increases at a position where the Π-shaped protrusions 94, 96(1) and 96(2) are provided.

As described above, within the RF antenna 54 of the present embodiment, a gap is formed between the RF input terminal 60(RF-In) and the RF output terminal 60(RF-Out) at both ends of the inner coil segment 60 in a one-round loop of the inner coil 58. Further, in a one-round loop of the outer coil 62, a gap is formed between the RF input terminal 64(1)(RF-In) of the first outer coil segment 64(1) and the RF output terminal 64(2)(RF-Out) of the second outer coil segment 64(2) and another gap is formed between the RF output terminal 64(1)(RF-Out) of the first outer coil segment 64(1) and the RF input terminal 64(2)(RF-In) of the second outer coil segment 64(2).

If such gaps exist in the one-round loops of the inner coil 58 and the outer coil 62, an induced electromotive force cannot be applied to plasma directly under the gaps. Thus, electron density would be reduced and each gap may easily become a singularity in the circumferential direction.

By way of example, when there is one singularity at a coil having a radius R in the circumferential direction, plasma density may become non-uniform at a position corresponding to a characteristic length of one round ($2\pi R$). Thus, the plasma needs to be uniformized by diffusion over the distance of $2\pi R$ before reaching the substrate. However, if there are n number of singularities ($n \geq 2$) in the circumferential direction, the characteristic length is shortened to $2\pi R/n$.

Accordingly, in this configuration example, the protrusions 94, 96(1) and 96(2) provided at the midway positions (desirably, exactly middle positions) of the respective coil segments 60, 64(1) and 64(2) serve as dummy gaps with respect to the plasma, and become singularities equivalent to the gaps at the ends of the coil segments. That is, as the number of the singularities in the circumferential direction is increased, plasma density distribution after the diffusion can be more uniform.

Further, the protrusions 94, 96(1) and 96(2) have a function of adjusting coil lengths of the coil segments 60, 64(1) and 64(2), respectively. That is, by appropriately adjusting gap widths or heights of the protrusions 94, 96(1) and 96(2), the coil lengths can be adjusted while diameters of the coil segments 60, 64(1) and 64(2) are maintained constant. Accordingly, a difference in self-inductances between the coil segments 60, 64(1) and 64(2) can be corrected.

Figure 21A:
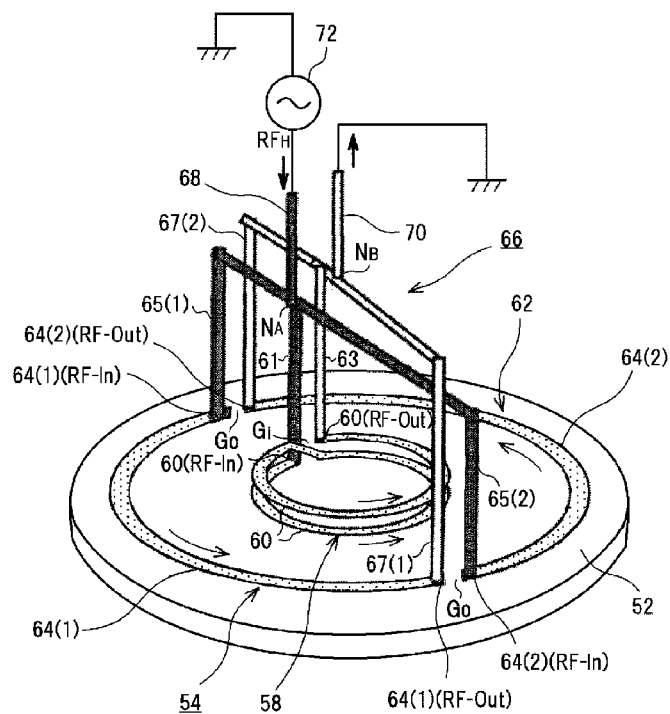
FIG. 21A is a perspective view illustrating an configuration example of a RF antenna in accordance with the present disclosure.
Figure 24:
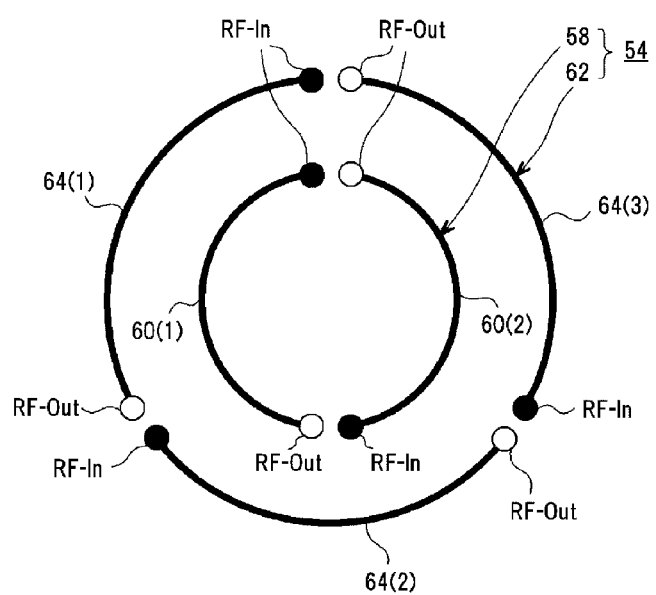
FIG. 24 is a diagram illustrating another experimental example of the RF antenna in accordance with the present disclosure.

FIG. 21A (21B) to FIG. 24 illustrate configuration examples in which a multiple number of winding coils is provided within the RF antenna 54.

Figure 21B:
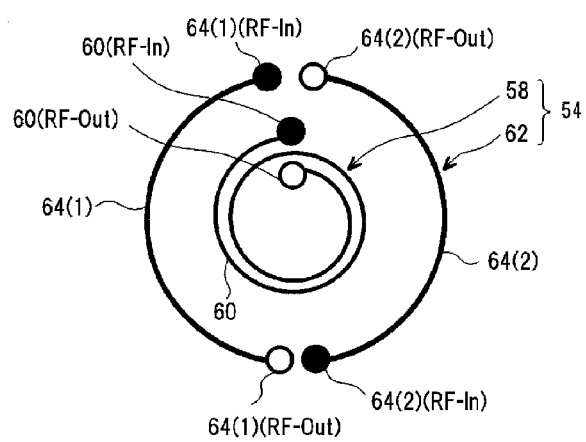
FIG. 21B is an electric connection diagram corresponding to the configuration example of FIG. 21A.

In the configuration example shown in FIGS. 21A and 21B, an inner coil 58 includes a single-body inner coil segment 60 and is wound in two rounds (two turns). Further, an outer coil 62 includes two outer coil segments 64(1) ad 64(2), and is wound in one round (one turn). The inner coil wound multiple times may have a spiral shape in a vertical direction, as shown in FIGS. 21A and 21B. However, the inner coil 58 may have a vortex shape in a horizontal direction or in a radial direction.

Figure 22:
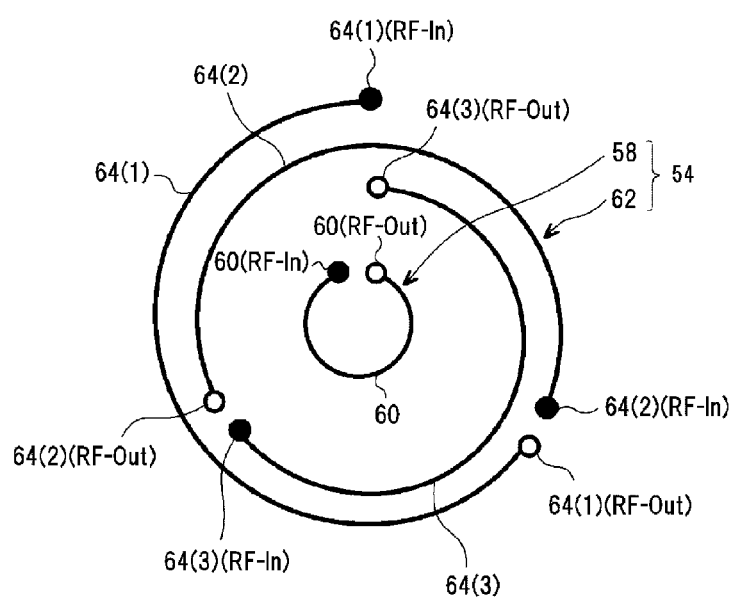
FIG. 22 is a diagram illustrating another experimental example of the RF antenna in accordance with the present disclosure.

In the configuration example shown in FIG. 22, an inner coil 58 includes a single-body inner coil segment 60 and is wound in one round (one turn). Further, an outer coil 62 includes three outer coil segments 64(1), 64(2) and 64(3) and is wound in two rounds (two turns). In this case, the outer coil 62 wound multiple times may have a spiral shape or a vortex shape.

Figure 23A:
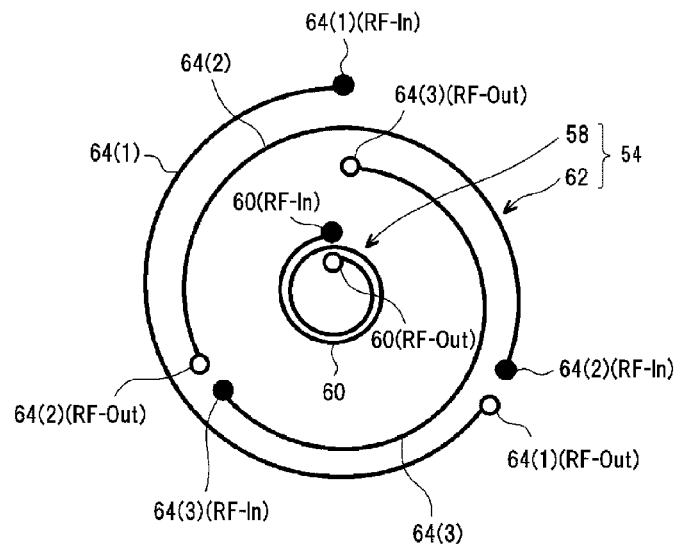
FIGS. 23A and 23B are diagrams illustrating another experimental example of the RF antenna in accordance with the present disclosure.

In the configuration example shown in FIG. 23A, an inner coil 58 includes a single-body inner coil segment 60 and is wound in two rounds (two turns). Further, an outer coil 62 includes three outer coil segments 64(1), 64(2) and 64(3) and is wound in two rounds (two turns). In this case, each of the inner coil 58 and the outer coil 62 wound multiple times may have a spiral shape or a vortex shape.

If the coil 62 is of a vortex shape, a start point and an end point of the vortex become singularities on a loop. In the present disclosure, by taking an advantage of the configuration in which a gap $G_o$ exists in a part of the vortex, all gaps $G_o$ may serve as singularities. As a result, it is possible to provide the singularities at multiple number of positions (e.g., three positions) at an equal distance. With this configuration, it is also possible to achieve an effect of uniformalizing plasma density distribution after plasma diffusion in the circumferential direction of the coil.

Figure 23B:
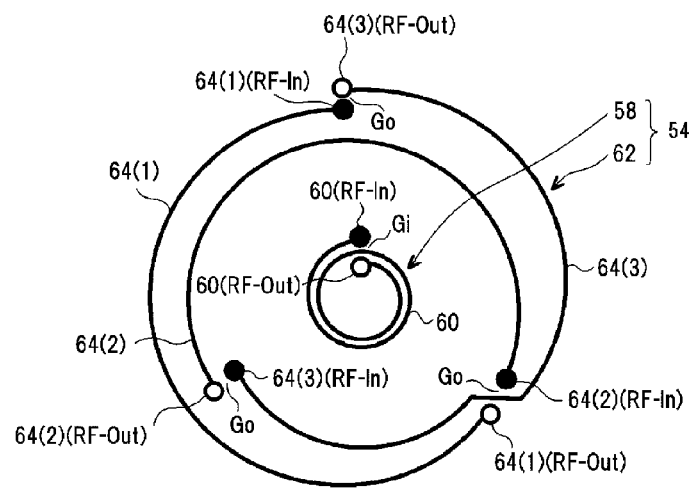

Further, the gaps $G_o$ between two adjacent coil segments 64(1) and 64(2), 64(2) and 64(3), and 64(3) and 64(1) on the same coil (loop) may not be provided in the circumferential direction. By way of example, as illustrated in FIG. 23B, the gaps $G_o$ may be formed in a direction perpendicular to the circumferential direction, i.e., in a vertical direction or in a radial direction. Likewise, when the inner coil segment 60 of the inner coil 58 is formed of the single-body, a gap $G_i$ between both ends of the inner coil 58 may be formed in these various directions.

In the RF antenna of the present disclosure, the number of the inner coil segments 60 of the inner coil 58, and the number of the outer coil segments 64 of the outer coil 62 may be selected appropriately. By way of example, as in the configuration examples shown in FIGS. 22 to 23B, the outer coil 62 may include the three outer coil segments 64(1), 64(2) and 64(3).

Alternatively, as shown in FIG. 24, the inner coil 58 may include a multiple number of (for example, two) coil segments 60(1) and 60(2).

Figure 25:
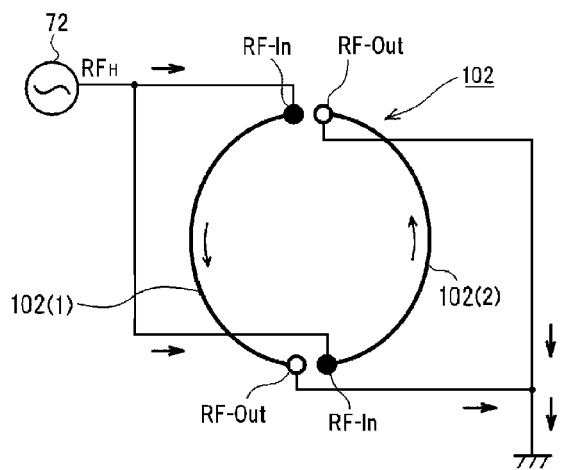
FIG. 25 is a diagram illustrating another experimental example of the RF antenna in accordance with the present disclosure.

Further alternatively, the number of coils of the RF antenna of the present disclosure need not necessarily be plural, but the RF antenna may include a single coil 102, as depicted in FIG. 25. In FIG. 25, although the coil 102 is shown to be divided in two coil segments 102(1) and 102(2), the coil 102 may be divided into three or more coil segments.

Figure 26:
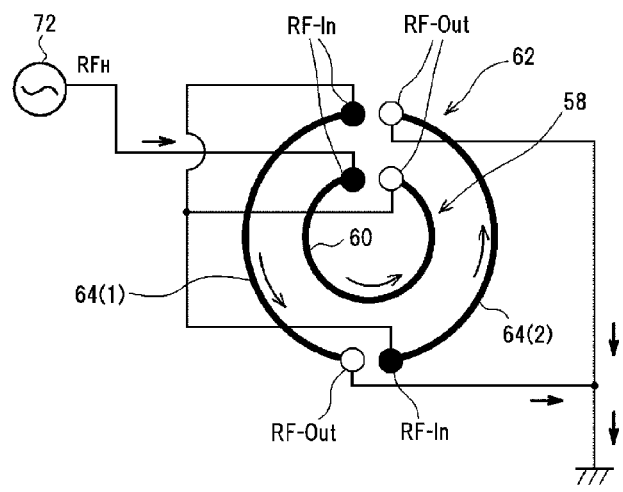
FIG. 26 is a diagram illustrating another experimental example of the RF antenna in accordance with the present disclosure.

In the above-described embodiment, within the RF antenna 54, the inner coil 58 and the outer coil 62 are electrically connected in parallel. As shown in FIG. 26, however, the inner coil 58 and the outer coil 62 may be electrically connected in series.

Further, all the coil segments of the RF antenna of the present disclosure may not have the same length. By way of example, the inner coil segment 60 of the inner coil 58 and each of the outer coil segments 64(1) and 64(2) of the outer coil 62 may have different lengths. A ratio between the inner coil segment 60 and each of the outer coil segments 64(1) and 64(2) may become about 1:2 or 1:0.8. In such a case, although the magnitude of the current flowing in the inner coil 58 and the magnitude of the current flowing in the outer coil 62 may be varied at a certain ratio, an optimum balance between magnetomotive forces of the two coils may be obtained in the radial direction. As a result, desired plasma density distribution may be obtained.

Figure 27:
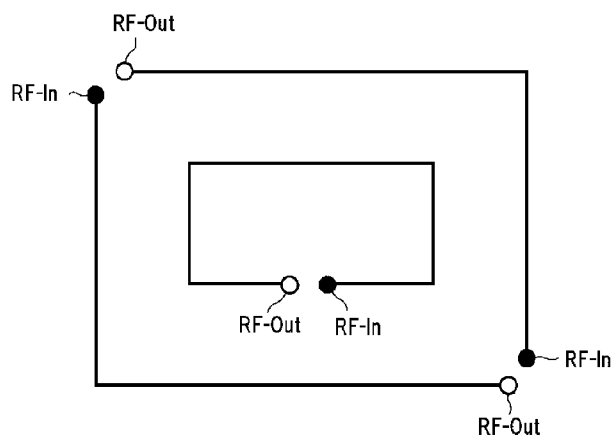
FIG. 27 is a diagram illustrating another experimental example of the RF antenna in accordance with the present disclosure.
Figure 28:
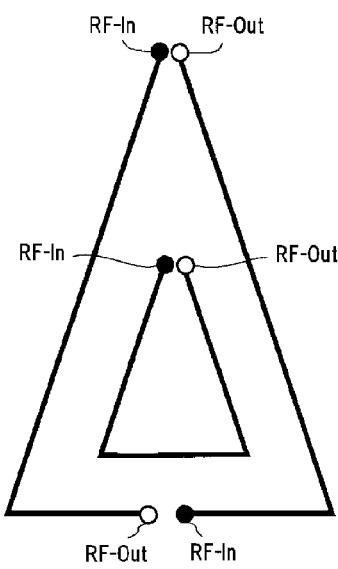
FIG. 28 is a diagram illustrating another experimental example of the RF antenna in accordance with the present disclosure.

The loop shape of the coil of the RF antenna may not be limited to a circular shape. By way of example, the loop shape may have a rectangular shape as shown in FIG. 27 or a triangular shape as shown in FIG. 28. Furthermore, the multiple number of coil segments of each coil (loop) may have different shapes or different self-impedances. A cross sectional shape of the coil or coil segment may not be limited to a rectangular shape or may be a circular or an ellipse shape. Further, the coil may be a single wire or a stranded wire.

Figure 29:
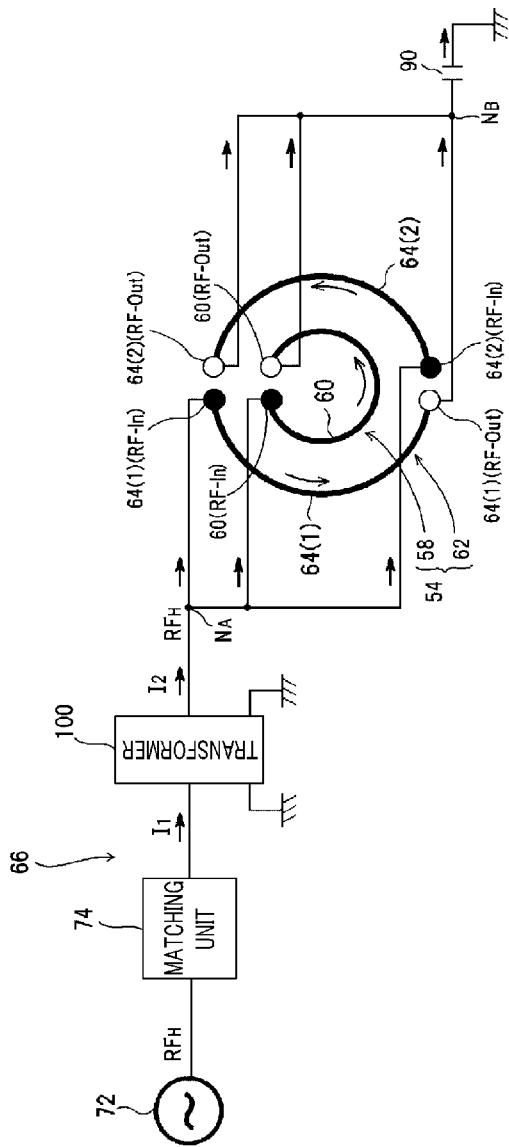
FIG. 29 is a diagram illustrating a configuration example of providing a transformer between a RF antenna in accordance with the present disclosure and a matching unit of a high frequency power supply.

FIG. 29 shows a configuration example in which a transformer 100 is provided between the matching unit 74 of the high frequency power supply unit 66 and the RF antenna 54. A primary coil of the transformer 100 is electrically connected with an output terminal of the matching unit 74, while a secondary coil is electrically connected with the first node $N_A$ on the input terminal of the RF antenna 54. As a desirable example of the transformer 100, by setting a winding number of the primary coil to be larger than a winding number of the secondary coil, an amount of a current (primary current) $I_1$ flowing from the matching unit 74 to the transformer 100 can be set be smaller than that of a current (secondary current) $I_2$ flowing from the transformer 100 to the RF antenna 54. In another view point, the amount of the secondary current $I_2$ supplied to the RF antenna 54 can be increased without increasing the amount of the primary current $I_1$. Further, by performing tap switching on the secondary side of the transformer 100, it may be possible to vary the secondary current $I_2$.

In the above-described embodiment, the illustrated configuration of the inductively coupled plasma etching apparatus is nothing more than an example. Not only each component of the plasma generating mechanism but also each component which is not directly relevant to plasma generation can be modified in various manners.

By way of example, the RF antenna can adopt a dome shape as a basic shape besides the planar shape mentioned above. Further, it may be also possible to have configuration in which a processing gas is introduced through a ceiling into the chamber 10 from the processing gas supply unit. Furthermore, it may be also possible not to apply a high frequency power $RF_L$ for DC bias control to the susceptor 12.

The inductively coupled plasma processing apparatus or the inductively coupled plasma processing method of the present disclosure can be applied to, not limited to a plasma etching technology, other plasma processes such as plasma CVD, plasma oxidation, plasma nitridation, and sputtering. Further, the target substrate in the present disclosure may include, but is not limited to a semiconductor wafer, various kinds of substrates for a flat panel display or photo mask, a CD substrate, and a print substrate.

What is claimed is:

1. A plasma processing apparatus, comprising:
   a processing chamber having a dielectric window;
   a substrate holding unit for holding thereon a processing target substrate within the processing chamber;
   a processing gas supply unit configured to supply a processing gas into the processing chamber in order to perform a plasma process on the substrate;
   a RF antenna provided outside the dielectric window in order to generate plasma of the processing gas within the processing chamber by inductive coupling; and
   a high frequency power supply unit configured to supply a high frequency power having a frequency for generating a high frequency electric discharge of the processing gas,
   wherein the RF antenna includes an inner coil and an outer coil arranged concentrically and respectively provided at an inner side and an outer side thereof in a radial direction with a gap there-between, the inner coil includes a single inner coil segment or more than one inner coil segments extended along one round, separated in a circumferential direction and connected in series, the outer coil includes a plurality of outer coil segments extended along one round and separated in a circumferential direction and electrically connected with each other in parallel, self-inductances of the inner and outer coil segments are all substantially same, the inner coil and outer coil are configured such that an entire diameter of the RF antenna is adjusted so that a diameter ratio between the inner coil and the outer coil is maintained constant for adjusting a plasma density distribution on the processing target substrate, and the inner coil, the outer coil including the segments are located on a same plane, and lengths of the inner and outer coil segments are substantially same.

2. The plasma processing apparatus of claim 1, wherein both ends of the inner coil segment are adjacent to each other with an inner gap therebetween.

3. The plasma processing apparatus of claim 1, wherein the inner coil segment is extended at least one round in a circumferential direction.

4. The plasma processing apparatus of claim 1, wherein a length of the inner coil segment is shorter than about ¼ of a wavelength of the high frequency power.

5. The plasma processing apparatus of claim 1, wherein the plurality of outer coil segments are arranged so as to be extended along one round in the circumference or along the most of one round in the circumference as a whole.

6. The plasma processing apparatus of claim 1, wherein between the plurality of outer coil segments, a high frequency input terminal of one outer coil segment of the plurality of outer coil segments is adjacent to a high frequency output terminal of another outer coil segment thereof with an outer gap therebetween, and a high frequency output terminal of said one outer coil segment is adjacent to a high frequency input terminal of said another outer coil segment with an outer gap therebetween.

7. The plasma processing apparatus of claim 6, wherein all the outer gaps are formed in a circumferential direction of a loop.

8. The plasma processing apparatus of claim 6, wherein at least one of the outer gaps is formed in a direction perpendicular to a circumferential direction of a loop.

9. The plasma processing apparatus of claim 6, wherein, in the circumferential direction of the outer coil, the outer gaps of the outer coil are not overlapped with an inner gap of the inner coil and the outer gaps of the outer coil are arranged so as not to face each other with a half-round gap therebetween.

10. The plasma processing apparatus of claim 1, wherein a length of each of the plurality of outer coil segments is shorter than about ¼ of a wavelength of the high frequency power.

11. The plasma processing apparatus of claim 1, wherein the plurality of outer coil segments have substantially the same self-inductance.

12. The plasma processing apparatus of claim 1, wherein directions of electric currents flowing in the plurality of outer coil segments are same in the circumferential direction.

13. The plasma processing apparatus of claim 1, wherein magnitudes of electric currents flowing in the plurality of outer coil segments are substantially same.

14. The plasma processing apparatus of claim 1, wherein a direction of an electric current flowing in the inner coil and a direction of an electric current flowing in the outer coil are same in the circumferential direction.

15. The plasma processing apparatus of claim 1, wherein directions of electric currents flowing in the inner and outer coil segments are all same.

16. The plasma processing apparatus of claim 1, wherein magnitudes of electric currents flowing in the inner and outer coil segments are all substantially same.

17. The plasma processing apparatus of claim 1, wherein the inner coil and the outer coil are electrically connected with each other in parallel between a first node on the side of the high frequency power supply unit and a second node on a ground potential side.

18. The plasma processing apparatus of claim 17, wherein, between the first node and the second node, an inner impedance adjusting unit is electrically connected to the inner coil segment in series, while no impedance adjusting unit is electrically connected to any one of the plurality of outer coil segments.

19. The plasma processing apparatus of claim 18, wherein the inner impedance adjusting unit is connected between the inner coil segment and the second node.

20. The plasma processing apparatus of claim 17, wherein, between the first node and the second node, a plurality of outer individual impedance adjusting units are electrically connected in series to the plurality of outer coil segments, respectively, while no impedance adjusting unit is electrically connected to the inner coil segment.

21. The plasma processing apparatus of claim 20, wherein all the plurality of outer individual impedance adjusting units are fixed capacitors.

22. The plasma processing apparatus of claim 21, wherein electrostatic capacitances of the plurality of outer individual impedance adjusting units are substantially all same.

23. The plasma processing apparatus of claim 20, wherein all the plurality of outer individual impedance adjusting units are variable capacitors.

24. The plasma processing apparatus of claim 20, wherein at least one of the plurality of individual impedance adjusting units is a variable capacitor.

25. The plasma processing apparatus of claim 14, wherein between the first node and the second node, an inner impedance adjusting unit is electrically connected to the inner coil segment in series, while a plurality of outer individual impedance adjusting units are electrically connected in series to the plurality of outer coil segments, respectively.

26. The plasma processing apparatus of claim 17, further comprising:

an outer common impedance adjusting unit electrically connected in series to all the plurality of outer coil segments and electrically connected in parallel to the inner coil segment between the first node and the second node.

27. The plasma processing apparatus of claim 17, further comprising:

an output side common capacitor connected between the second node and a ground potential member.

28. The plasma processing apparatus of claim 1, wherein the inner coil and the outer coil are electrically connected with each other in series.

29. The plasma processing apparatus of claim 1, wherein the inner coil and the outer coil are coaxially arranged.

30. The plasma processing apparatus of claim 1, wherein the inner coil and the outer coil are parallel to the dielectric window.

31. A plasma processing apparatus, comprising:

a processing chamber having a dielectric window;

a substrate holding unit for holding thereon a processing target substrate within the processing chamber;

a processing gas supply unit configured to supply a processing gas into the processing chamber in order to perform a plasma process on the substrate;

a RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas, wherein the RF antenna includes an inner coil and an outer coil arranged concentrically and respectively provided at an inner side and an outer side thereof in a radial direction with a gap there-between, the inner coil includes a plurality of inner coil segments extended along one round and separated in a circumferential direction and electrically connected with each other in parallel, the outer coil includes a plurality of outer coil segments extended along one round and separated in a circumferential direction and electrically connected with each other in parallel, self-inductances of the inner and outer coil segments are all substantially same, the inner coil and outer coil are configured such that an entire diameter of the RF antenna is adjusted so that a diameter ratio between the inner coil and the outer coil is maintained constant for adjusting a plasma density distribution on the processing target substrate, and the inner coil, the outer coil and their segments are located on a same plane, and lengths of the inner and outer coil segments are substantially same.

32. The plasma processing apparatus of claim 31, wherein between the plurality of inner coil segments, a high frequency input terminal of one inner coil segment of the plurality of inner coil segments is adjacent to a high frequency output terminal of another inner coil segment thereof with a gap therebetween, and a high frequency output terminal of said one inner coil segment is adjacent to a high frequency input terminal of said another inner coil segment with a gap therebetween.

33. The plasma processing apparatus of claim 31, wherein a length of each of the plurality of inner coil segments is shorter than about ¼ of a wavelength of the high frequency power.

34. The plasma processing apparatus of claim 31, wherein the plurality of inner coil segments have substantially the same self-inductance.

35. The plasma processing apparatus of claim 31, wherein directions of electric currents flowing in the plurality of inner coil segments are all same in the circumferential direction.

36. The plasma processing apparatus of claim 31, wherein magnitudes of electric currents flowing in the plurality of inner coil segments are substantially same.

37. The plasma processing apparatus of claim 31, wherein a direction of an electric current flowing in the inner coil and a direction of an electric current flowing in the outer coil are same in the circumferential direction.

38. The plasma processing apparatus of claim 31, wherein directions of electric currents flowing in the inner and outer coil segments are all same.

39. The plasma processing apparatus of claim 31, wherein magnitudes of electric currents flowing in the inner and outer coil segments are all substantially same.

40. The plasma processing apparatus of claim 31, wherein the inner coil and the outer coil are electrically connected with each other in parallel.

41. The plasma processing apparatus of claim 31, wherein the inner coil and the outer coil are electrically connected with each other in series.

* * * * *